United States Patent [19]
Eyuboglu et al.

[11] Patent Number: 5,214,672
[45] Date of Patent: May 25, 1993

[54] TRELLIS PRECODING FOR FRACTIONAL BITS/BAUD

[75] Inventors: Vedat Eyuboglu; Michael P. Chen, both of Boston, Mass.

[73] Assignee: Codex Corporation, Mansfield, Mass.

[21] Appl. No.: 505,418

[22] Filed: Apr. 6, 1990

[51] Int. Cl.$^5$ .............................................. H04L 27/34
[52] U.S. Cl. ........................................ 375/34; 375/39; 371/43
[58] Field of Search ............... 375/39, 27, 34; 371/43; 332/103, 106

[56] References Cited

U.S. PATENT DOCUMENTS

| | | | |
|---|---|---|---|
| 4,077,021 | 2/1978 | Csajka etal. | 371/43 |
| 4,586,182 | 4/1986 | Gallager | 371/43 |
| 4,713,817 | 12/1987 | Wei | 375/39 |
| 4,959,842 | 9/1990 | Forney, Jr. | 332/103 |
| 5,048,054 | 9/1991 | Eyuboglu et al. | 375/8 |

OTHER PUBLICATIONS

"Rotationally Invariant Convolutional Channel Coding with Expanded Signal Space—Part I: 180° and—Part II:Nonlinears Codes" IEEE JSAC, pp. 659-686.

"Multidimentional Constellations—Part I:Introduction, Figures of Merit, and Generalized Cross Constellations", IEEE JSAC, pp. 877-892, Aug. 1989.

Forney et al., "Efficient Modulation for Band-Limited Channels", JSAC, vol. 2, No. 5, Sep., 1984.

Forney and Wei, IEEE Journal on Selected Areas in Communication 7:877-892, 1989 "Multidimensional Constellations—Part I:Introduction, Figures of Merit and Generalized Cross Constallations".

Forney, IEEE Journal on Selected Areas in Communications 1-43, 1988 "Multidemensional Constallations-Part II: Voroni Constallations".

Forney et al., IEEE Transactions on Information Theory 34:1123-1151, 1988, "Coset Codes—Part I: Introduction and Geometrical Classication".

Wei IEEE Transactions on Information Theory 33:483-501, 1987 "Trellis-Coded Modulation with Multidimensional Constellations".

Price, "Nonlinearly Feedback-Equalized PAM vs Capacity, for Noisy Filter Channels" 22-12-22-17.

Salz, The Bell System Technical Journal 52:1341-1373, 1973 "Optimum Mean-Square Decision Feedback Equalization".

Chevillat et al., Transactions on Communications 35:869-874, 1987 "Rapid Training of a Voiceband Data-Modem Receiver Employing an Equalizer with Fractional-T Spaced Coefficients".

Primary Examiner—Curtis Kuntz
Assistant Examiner—Young Tse
Attorney, Agent, or Firm—Fish & Richardson

[57] ABSTRACT

A digital data sequence is mapped into a signal point sequence e(D) for data transmission over a channel h(D) to produce a channel output sequence y(D)=e(D)h(D). e(D) is chosen so that the signal points in the sequence y(D) belong to a class of possible sequences based on the digital data sequence, the class being based on a time-varying trellis code derived from an N-dimensional time-invariant trellis code by using different transformed versions of its underlying lattices for respectively different N-dimensional symbols.

34 Claims, 17 Drawing Sheets

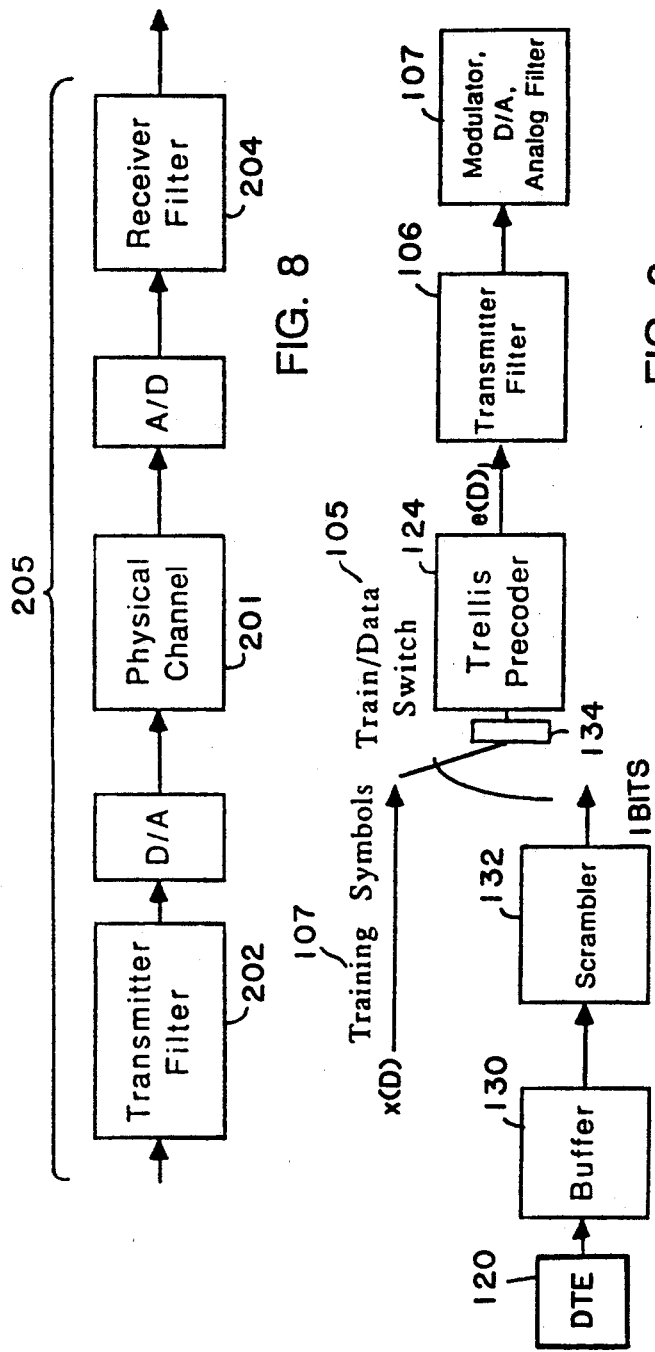
FIG. 8
FIG. 9
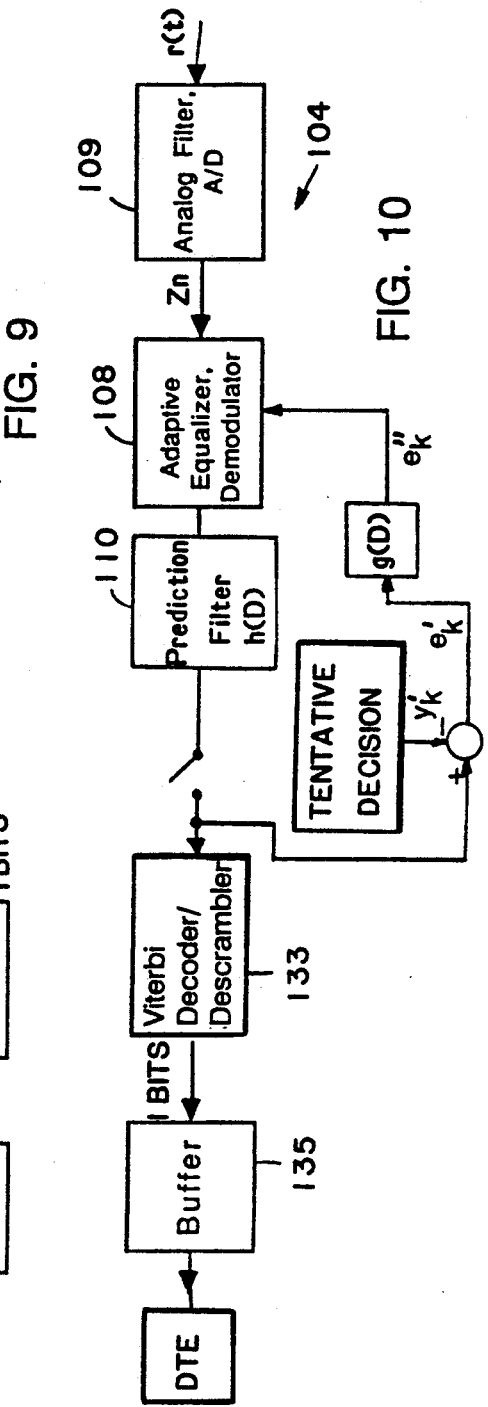
FIG. 10

| 01 | 11 |
|----|----|
| 00 | 10 |

TRELLIS PRECODING FOR FRACTIONAL BITS/BAUD

BACKGROUND OF THE INVENTION

This invention relates to modulation systems for sending digital data via a channel.

In a quadrature amplitude modulation (QAM) system, for example, two key parameters are the baud rate $1/T$ and the number of bits per baud $\beta$. The bit rate R of the QAM system is given by $R=\beta/T$, measured in bits per second (b/s).

Transmission equipment, such as a voiceband modem, operates at one of a number of possible bit rates (e.g., in the range 9.6 to 19.2 kb/s) depending on the line quality or the user's requirement. Therefore, for a given baud rate such a modem must be able to operate at different values of $\beta$, which may be a fraction, and the different values of $\beta$ may not differ simply by integers. For example, if the baud rate is 2743 symbols/s, then to send at conventional modem rates of 19.2, 16.8, and 14.4 kb/s requires $\beta=7$, 6.125 and 5.25, respectively.

When $\beta$ is a rational number of the form $\beta=n+d/2^m$, where n and $0\leq d<2^m$ are integers, a higher-dimensional (higher than two-dimensional) QAM constellation of dimension $L=2^{m+1}$ with $2^{\beta L/2}$ points can be used to represent $\beta L/2$ bits over L dimensions. Higher-dimensional constellations save in average power when their signal points are chosen to lie within hyperspheres instead of hypercubes. This saving, called shaping gain, can be as high as 1.53 dB.

Because the size of the signal constellation increases rapidly with n and m, mapping from bits to signal points can be cumbersome. For example, in an uncoded system (one in which there is no interdependence between selected signal points), to send 7.5 bits/baud, a four-dimensional constellation with $2^{15}=32,768$ points is needed, which may be too large to handle. However, such a 4D constellation can be formed by the Cartesian product of simple 128-point and 256-point two-dimensional constellations. More generally, a simple way of sending $\beta=n+d/2^m$ bits per two-dimensions is to define a series of frames each encompassing the bits in a group of $2^m$ bauds and then for each frame send n bits/baud for $(2^m-d)$ bauds and send $(n+1)$ bits/baud for d bauds. The average power per two-dimensions for this scheme is approximately $P_\beta=P_n(1+d/2^m)$, where $P_n$ is the average power of a $2^n$-point two-dimensional (2D) QAM constellation (The 2D constellations are scaled to have the same minimum distance between adjacent points.). This approach is approximately as efficient as a conventional QAM system sending an integer number of bits/baud. However, the imbalance in size between the two 2D constituent constellations creates a large peak-to-average ratio (PAR) in two-dimensions, making the system susceptible to other impairments such as nonlinear distortion or phase jitter.

Generalized cross-constellations, described by Forney and Wei, "Multidimensional Constellations—Part I: Introduction, Figures of Merit, and Generalized Cross Constellations," IEEE JSAC, pp 877–892, August, 1989, offer an alternative way of generating higher-dimensional constellations to represent fractional bits/baud. Here, the higher-dimensional constellation is a subset of the signal points in a Cartesian product of identical expanded two-dimensional constellations; simple coding rules are used to construct the subset. A generalized cross-constellation has a low 2D constellation expansion ratio (CER) and a low PAR in two-dimensions; however, it also generally has a low shaping gain.

Higher-dimensional constellations with simplified bit mapping and with significant shaping gain can be constructed using the Voronoi region of a lattice $\Lambda'$ as the boundary of the signal point set, Forney, "Multidimensional Constellations—Part II: Voronoi Constellations," IEEE JSAC, pp 877–892, August, 1989. If signal points are chosen from some lattice $\Lambda$, then $\Lambda$ and $\Lambda'$ must be scaled such that the Voronoi region of $\Lambda$ contains $2^{\beta L/2}$ points from $\Lambda$; that means the order $|\Lambda/\Lambda'|$ of the lattice partition $\Lambda/\Lambda'$ must be $2^{\beta L/2}$. The mapping of bits to signal points involves a decoding operation whose complexity is that of a minimum-distance decoder for $\Lambda'$. The inverse mapping is accomplished by a simple hard-decision decoding operation. A Voronoi constellation generally is more complex to generate than a generalized cross constellation. For given lattices $\Lambda$ and $\Lambda'$, the Voronoi constellation can typically support only certain fractional values of $\beta$, and that by using different versions of $\Lambda'$.

An important expansion of the Voronoi constellation technique is trellis shaping disclosed in U.S. patent application Ser. No. 312,254, filed Feb. 16, 1989, assigned to the same assignee as this application, and incorporated herein by reference. In trellis shaping, the signal constellation is constructed on a sequence basis rather than on a block basis. Instead of the Voronoi region of a lattice, the decision regions associated with trellis codes are used to form the signal constellation boundary. In analogy to Voronoi constellations, in trellis shaping the mapping from bits to signal points involves a decoder for the trellis code. Trellis shaping offers a better performance/complexity trade-off than Voronoi constellations; but, it also can support only certain fractional values of $\beta$.

An extension of Voronoi constellations and trellis shaping to non-ideal channels with linear distortion or correlated noise has been disclosed in U.S. Pat. No. 5,048,054, assigned to the same assignee as this invention, and incorporated by reference. This extension, called lattice or trellis precoding, provides the performance of ideal decision feedback equalization (DFE), preserves the coding gain of known coded modulation schemes designed for ideal channels, and, in addition, provides shaping gain. Trellis precoding is similar to trellis shaping, however, it involves a decoder for a filtered trellis code rather than for the ordinary trellis code. Trellis precoding is a practically important scheme, but, like trellis shaping, is limited in the fractional values of $\beta$ that it can support.

SUMMARY OF THE INVENTION

The invention can support values of $\beta$ (bits per baud) that differ by fractions without significantly modifying the underlying trellis codes used in the previously disclosed trellis precoding scheme. This is achieved by using a shaping trellis code $\underline{C}_s$ which is derived from some conventional trellis code $\underline{C}(\Lambda/\Lambda',C)$ by using different versions of the underlying lattices $\Lambda$ and $\Lambda'$ at different times, in a periodic fashion. For example, if $\underline{C}$ is an N-dimensional trellis code, to send $(N/2)\beta=n+(d/2^m)(N/2)$ bits/N-dimensions, where $0\leq d<2^m$, we define a frame (period) of length $L/2=(N/2)2^m$ bauds, and use the code $\underline{C}$ for $(N/2)(2^m-d)$ bauds, and its scaled version $R\underline{C}$ for $(N/2)d$ bauds.

In general, in one aspect, the invention features mapping a digital data sequence into a signal point sequence $e(D)$ for data transmission over a channel $h(D)$ to produce a channel output sequence $y(D)=e(D)h(D)$. $e(D)$ is chosen so that the signal points in the sequence $y(D)$ belong to a class of possible sequences based on the digital data sequence, the class being based on a time-varying trellis code derived from an N-dimensional time-invariant trellis code by using different transformed versions of its underlying lattices for respectively different N-dimensional symbols.

Preferred embodiments include the following features. In some embodiments, the class comprises a signal space translate of a time-varying trellis code $\underline{C}_s$, where the translation is a code sequence from a translate of a trellis code $\underline{C}_c$ determined based on the digital data sequence, and the time-varying trellis code $\underline{C}_s$ is derived from an N-dimensional time-invariant trellis code $\underline{C}(\Lambda/\Lambda', C_s)$ by using different transformed versions of its underlying lattices $\Lambda$ and $\Lambda'$ for respectively different N-dimensional signal points.

In some embodiments, the class comprises a signal space translate of a trellis code $\underline{C}_s$, where the translation is a code sequence from a translate of a time-varying trellis code $\underline{C}_c$ determined based on the digital data sequence and the time-varying trellis code $\underline{C}_c$ is derived from an N-dimensional time-invariant trellis code $\underline{C}(L/L', C_c)$ by using different transformed versions of its underlying lattices $L$ and $L'$ for respectively different N-dimensional signal points.

In some embodiments, the class comprises a signal space translate of a label translate of a time-varying trellis code $\underline{C}_s$, where the label translate is based on a portion of the digital data sequence and the signal space translation is based on another portion of the elements of the digital data sequence, and the time-varying trellis code $\underline{C}_s$ is derived from an N-dimensional time-invariant trellis code $\underline{C}(\Lambda/\Lambda', C_s)$ by using different transformed versions of its underlying lattices $\Lambda$ and $\Lambda'$ for respectively different N-dimensional signal points.

In some embodiments, the class comprises a signal space translate of a label translate of a trellis code $\underline{C}_s$, where the label translate is based on a portion of the digital data sequence, where the signal space translation is based on another portion of the elements of the digital data sequence and is a code sequence from a time-varying trellis code $\underline{C}_c$ which is derived from an N-dimensional time-invariant trellis code $\underline{C}(L/L', C_c)$ by using different transformed versions of its underlying lattices $L$ and $L'$ for respectively different N-dimensional signal points.

In some embodiments, the class of possible sequences is identified by some sequence of subregions into which N-space has been partitioned, the sequence of subregions being specified by a label sequence which belongs to a coset of a convolutional code $C_s$ and the coset is determined based on a portion of the digital data sequence and the signal points in the subregions belonging to a coset of a time-varying trellis code $\underline{C}_c$, where the sequences from the trellis code $\underline{C}_c$ are chosen based on another portion of the elements of the digital data sequence, and the time-varying trellis code $\underline{C}_c$ is derived from an N-dimensional time-invariant trellis code $\underline{C}(L/L', C_c)$ by using different transformed versions of its underlying lattices $L$ and $L'$ for respectively different N-dimensional signal points.

In some embodiments, the class of possible sequences is identified by some sequence of subregions into which N-space has been partitioned, the sequence of subregions being specified by a label sequence which belongs to a coset of a convolutional code $C_s$, the signal points in the subregions belonging to a coset of a trellis code $\underline{C}_c$, where sequences from the trellis code $\underline{C}_c$ are chosen based on another portion of the elements of the digital data sequence and using different approximately scaled versions of the subregions for respectively different N-dimensional signal points.

In general, in another aspect, the invention features choosing $e(D)$ so that $y(D)$ belongs to a signal space translate of a label translate of a trellis code $\underline{C}_s$, the label translate being based on a portion of the digital data sequence, and the signal space translation is specified based on another portion of the elements of the digital data sequence and is a code sequence from a trellis code $\underline{C}_c$.

In general, in another aspect, the invention features choosing $x(D)$ so that the signal points in the sequence $y(D)$ belong to some sequence of subregions into which N-space has been partitioned, the sequence of subregions being specified by a label sequence which belongs to a coset of a convolutional code $C_s$, the coset being determined based on a portion of the digital data sequence, the signal points in the subregions belonging to a coset of a trellis code $\underline{C}_c$, and where sequences from the trellis code $\underline{C}_c$ are chosen based on another portion of the elements of the digital data sequence.

In preferred embodiments, the versions are respectively used periodically (e.g., two different versions used alternatingly) wherein each period encompasses multiple N-dimensional symbols. The transformed versions comprise rotated and/or scaled versions of the underlying lattices. The trellis code $C_s$ is filtered to form a filtered trellis code $C_s'$ whose sequences are $c_s'(D)=c_s(D)g(D)$ where $g(D)$ is the formal inverse of a response related to the channel response $h(D)$, and $c_s(D)$ is any code sequence in the trellis code $C_s$. The signal point sequence selection tends to minimize the average power of the signal point sequence $e(D)=y(D)g(D)$. The signal point sequence $e(D)$ lies in a fundamental region of the filtered trellis code $\underline{C}_s'$. The signal point sequence is selected based on reduced state sequence estimation with respect to the filtered trellis code $\underline{C}_s'$. The reduced state sequence estimation uses no more states than the number of states of the original trellis code $\underline{C}_s'$. The fundamental region of the filtered trellis code comprises approximately a Voronoi region of the filtered trellis code $\underline{C}_s'$. The digital data sequence is recovered from a possibly noise-corrupted version of the signal point sequence, including decoding the signal point sequence to a sequence of estimated digital elements and forming a syndrome of fewer digital elements based on a portion of the estimated digital elements using a feedback-free syndrome former $H^T$.

The signal point sequence is selected by mapping the digital data sequence into an initial sequence belonging to and representing a congruence class of the original trellis code $\underline{C}_s$, and choosing a signal point sequence belonging to and representing a congruence class of the filtered trellis code $C_s'$ and which has no greater average power than the initial sequence, and wherein the mapping includes applying a portion of the elements of the digital data sequence to a coset representative generator for forming a larger number of digital elements representing a coset representative sequence. The coset representative generator comprises a multiplication of a portion of the elements of the digital data sequence by a coset representative generator matrix $(H^{-1})^T$ which is inverse to a syndrome-former matrix $H^T$ for the code.

The trellis code $\underline{C}_s$ may be a linear trellis code or a non-linear trellis code. The linear trellis code $\underline{C}_s$ is a 4 state Ungerboeck code. The trellis code $\underline{C}_s$ is based on a partition of binary lattices, or a partition of ternary or quaternary lattices.

The step of selecting the signal point sequence is further constrained so as to reduce the peak power of the signal point sequence where the peak power represents the maximum energy of the signal point sequence in some number of dimensions N. In some embodiments, $N=2$ or $N=4$. The step of mapping the digital data sequence into the signal point sequence is arranged to ensure that the digital data sequence can be recovered from a channel-affected version of the signal point sequence which has been subjected to one of a number of predetermined phase rotations.

Other advantages and features will become apparent from the following description of the preferred embodiment and from the claims.

DESCRIPTION OF THE PREFERRED EMBODIMENT

We first briefly describe the drawings.

FIG. 8 is a general block diagram of a transmitter and a receiver used in precoding.

FIG. 9 is a block diagram of a transmitter.

FIG. 10 is a block diagram of a receiver.

TRELLIS PRECODING

First we will summarize the principles of trellis precoding. Certain terminology and principles which underlie the invention are set forth in Appendix A.

Figure 1:
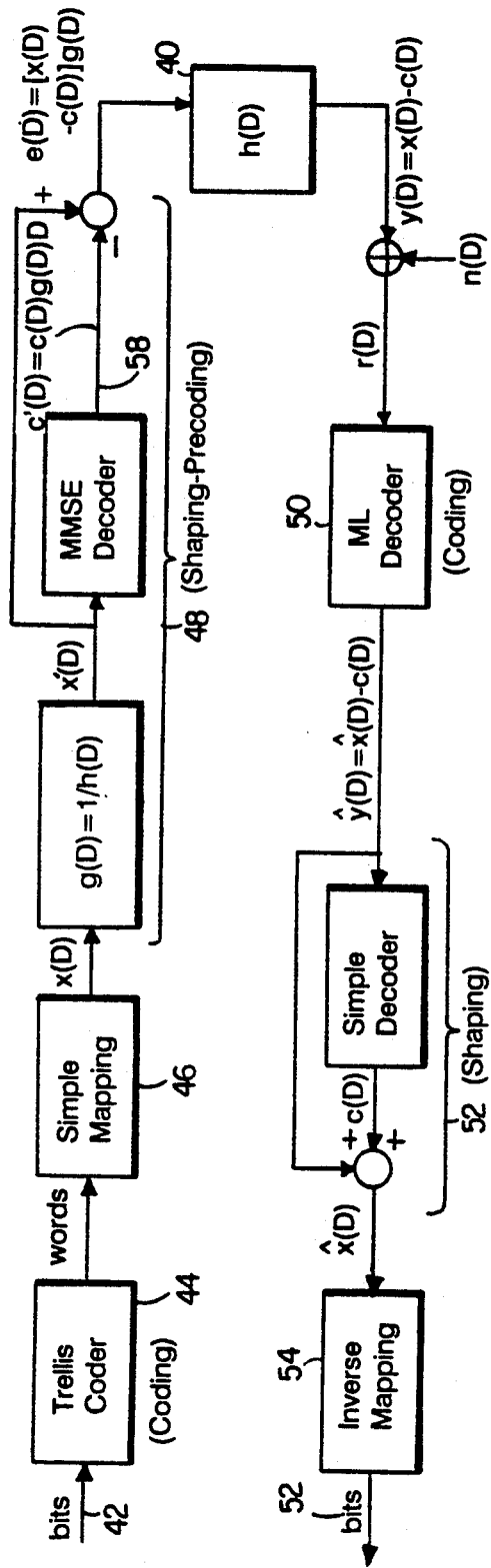
FIG. 1 is a block diagram of trellis precoding.

Referring to FIG. 1, trellis precoding is an encoding technique based on a discrete-time channel 40 operating at a baud rate $1/T$. (If the actual channel is continuous-time, or discrete-time operating at a higher sampling rate, the discrete time channel at the baud rate can be constructed by appropriate filtering, sampling or sampling-rate conversion operations, as described in the trellis precoding patent application cited above).

We assume the following input-output relationship for the channel:

$$r(D) = e(D)h(D) + n(D)$$

where $e(D)$ is the channel input, $h(D)$ is a causal, stable channel response and $n(D)$ is a noise sequence that can be modeled approximately as Gaussian and white.

Let $\underline{C}_s(\Lambda_s/\Lambda_s'; C_s)$ be a time invariant trellis code based on N-dimensional lattices $\Lambda_s$ and $\Lambda_s'$ and a rate-$k_s/(k_s+r_s)$ binary convolutional code $\underline{C}_s$. As in the trellis shaping patent application cited above (Assumption A), we assume that $\underline{C}_s$ has the property that all possible symbols assigned to trellis branches leaving any state $s_k$ of the encoder belong to a coset $\Lambda_{0s} + a(s_k)$ of some lattice $\Lambda_{0S}$, called the time-zero lattice of $\underline{C}_s$.

The following theorem, which is proven in the Appendix, plays a central role in trellis precoding:

Theorem 1. Let $R_0$ be any fundamental region of the N-dimensional time-zero lattice $\Lambda_{0s}$ of $\underline{C}_s$, and let $x(D)\epsilon(R_0)^\infty$ and $c_s(D)\epsilon \underline{C}_s$ be unknown sequences whose sum is $y(D) = x(D) + c_s(D)$. Then $x(D)$ and $c_s(D)$ can be uniquely determined from $y(D)$.

This important theorem implies that if $x(D)$ is an information-bearing signal that lies in the region $(R_0)^\infty$, then instead of transmitting $x(D)$, one may transmit $e(D) = [x(D) + c_s(D)]g(D)$, where $g(D) = 1/h(D)$, and still be able to recover $x(D)$ at the receiver, provided that $c_s(D)\epsilon \underline{C}_s$. Any desired criterion may be used to select the code $\underline{C}_s$ and the code sequence $c_s(D)$. First, we consider strictly an average power criterion, in which case the code $\underline{C}_s$ and the code sequence $c_s(D)$ are chosen to minimize the average power of the transmitted sequence $e(D)$ (the mean-squared 'error').

In FIG. 1, the first step in trellis precoding is to map the incoming bit stream 42 into the information-bearing signal $x(D)$ using a trellis code 44 to map to words and simple mapping 46 to map from words to $x(D)$. For simplicity, the fundamental region $R_0$ in N-space can be chosen as the Cartesian product of simple two-dimensional rectangular regions.

To obtain coding gain we choose $x(D)$ from a coset of some trellis code $\underline{C}_c(\Lambda_c/\Lambda_c', C_c)$. Without much loss of generality, we assume that $\Lambda_c$ and $\Lambda_c'$ are both N-dimensional binary lattices and that $C_c$ is based on a binary rate-$k_c/(k_c+r_c)$ convolutional encoder. It is essential that $\underline{C}_s$ be a subcode of $\underline{C}_c$, which is assured if $\Lambda_s$ is a sublattice of $\Lambda_c'$. This implies that if $c_s(D)$ is a sequence from $\underline{C}_s$ and $x(D)$ is a sequence from $\underline{C}_c$, then $c_s(D) + x(D)$ is also a sequence from $\underline{C}_c$.

To send $\beta$ bits per two dimensions, we will initially require that the fundamental volume of $\Lambda_{0s}$ be $2^{N\beta/2 + r_c}$ times larger than the fundamental volume of $\Lambda_c$, so that $2^{N\beta/2+r_c}$ points from $\Lambda_c$ can be placed in $R_0$ (to accommodate the $N\beta/2$ information bits and $r_c$ redundant bits); i.e., $|\Lambda_c/\Lambda_{0s}|=2^{N\beta/2+r_c}$. Now, given $\underline{C}_c$ and $\underline{C}_s$, we can determine the values of $\beta$ that trellis precoding can support. First, we write the partition $\Lambda_c/\Lambda_{0s}$ more explicitly in terms of the partition chain $\Lambda_c/\Lambda_{0c}/\Lambda_s/\Lambda_{0s}$. We have $$|\Lambda_c'/\Lambda_{0c}|=2^{r_c}$$

$$|\Lambda_{0c}/\Lambda_c'|=2^{k_c}$$

$$|\Lambda_s/\Lambda_{0s}|=2^{r_s}.$$

Furthermore, if we define $|\Lambda_c'/\Lambda_s|=2^j$, where $j$ is some integer, then it follows that $\log_2 |\Lambda_c/\Lambda_{0s}|=r_c+k_c+r_s+j$, and therefore since also $\log_2 |\Lambda_c/\Lambda_{0s}|=N\beta/2+r_c, N\beta/2=k_c+r_s+j$; that means trellis precoding can support $\beta=(2/N)(k_c+r_s+j)$ bits per two dimensions (i.e., per baud in a QAM system).

Suppose we replace the code $\underline{C}_s$ by its scaled and rotated version $R\underline{C}_s$ that is based on the partition $R\Lambda_s/R\Lambda_s'$, where R is the N-dimensional rotation operator defined in G. D. Forney, Jr. "Coset codes—Part 1: Introduction and Geometrical Classification," IEEE Inform. Vol. Theory IT-34, pp. 1123-1151, Sep. 1, 1988. Then $|\Lambda_c'/R\Lambda_s|=2^{j+N/2}$ and hence $\beta=(2/N)(k_c+r_s+j)+1$. This illustrates that for binary lattices, trellis precoding can be scaled to support integer increments in $\beta$, by simply replacing the code $\underline{C}_s$ by its rotated, scaled versions. A similar effect can be achieved by replacing the code $\underline{C}_c$ by its scaled and rotated version $R\underline{C}_c$.

Having discussed the scaling and the mapping of bits into the information bearing sequence x(D), we now proceed to describe the remaining operations in trellis precoding.

Referring again to FIG. 1, once x(D) is determined, the trellis precoder 48 tries to find a code sequence $c_s(D) \epsilon \underline{C}_s$ such that the sequence $$e(D)=[x(D)-c_s(D)]g(D)$$

has as small an average power as possible. The 'error sequence' e(D) is then transmitted.

The received sequence is given by $$\begin{aligned}r(D) &= e(D)h(D)+n(D)\\&= y(D)+n(D)\\&= x(D)-c_s(D)+n(D).\end{aligned}$$

Since x(D) is chosen from a translate $\underline{C}_c+a(D)$ of $\underline{C}_c$, $y(D)=x(D)-c_s(D)$ is also a code sequence in $\underline{C}_c+a(\overline{D})$. Therefore, a conventional decoder 50 for $\underline{C}_c$ can estimate y(D) with essentially the same error probability as if x(D) were detected with an ideal DFE which cancels the ISI due to the tail of the impulse response. If the decoder can correctly recover $y(D)=x(D)-c_s(D)$, then it follows from Theorem 1 that x(D) can be correctly extracted using the simple hard-decision decoder 52 corresponding to the region $(R_0)^\infty$. In order to prevent an error in $y_k$ from triggering error propagation, the syndrome-former methods, disclosed in the trellis precoding patent application cited above, may be used. The original bit stream 42 may then be recovered by inverse mapping 54.

FRACTIONAL BITS PER BAUD

As demonstrated above, using trellis codes based on binary lattices, trellis precoding can support values of $\beta$, the transmitted bits/baud, that differ by integers. In the invention, trellis precoding can also support fractional differences in $\beta$ without significantly changing the shaping code $\underline{C}_s$.

This is achieved by deriving the shaping code $\underline{C}_s$ from some time-invariant code $\underline{C}$ by using different (rotated, scaled) versions of its underlying lattices, $\Lambda$ and $\Lambda'$, at different times in a periodic fashion. (Again, a similar effect can be achieved by deriving the coding code $\underline{C}_c$ from some time invariant code $\underline{C}(L/L', C_c)$ by using a different rotated, scaled version of its underlying lattices L and L'). As we saw above, if $\underline{C}(\Lambda/\Lambda',C)$ can support $k_c+r_s+j$ bits/N-dimensions, then it can be made to support $k_c+r_s+j+(N/2)$ bits/N-dimensions, by replacing $\Lambda$ and $\Lambda'$ by $R\Lambda$ and $R\Lambda'$, respectively. To send $(N/2)\beta=k_c+r_s+j+(d/2^m)(N/2)$ bits/N-dimensions, where $0 \leq d > 2^m$, we define a frame (period) of length $L/2=(N/2)2^m$ bauds, and use the code $\underline{C}$ for $(N/2)(2^m-d)$ bauds, and its scaled version $R\underline{C}$ for $(N/2)d$ bauds.

Using $R\underline{C}$ and $\underline{C}$ at different times will create an imbalance in 2D constellation sizes and result in a PAR that is higher than that of trellis precoding with time-invariant trellis codes. However, using constellation constraints, this imbalance will be substantially eliminated.

In the preferred embodiment, we use the 4D 16-state Wei code (described in the trellis precoding patent application) as the code for fundamental coding gain, and we use the 2D 4-state Ungerboeck code (described in the trellis precoding patent application) as the code for shaping gain. With this combination $N=4$, $k_c=3$, and $r_s=2$, and we can send at rates $n+0.5$ bits/baud using time-invariant scaling, where $n>2$ is an integer. To transmit at 19.2 kb/s using a baud rate of $1/T=2743$ symbols/s, however, we need to send 7 bits/baud. This may be done as follows.

The 4D 16-state Wei code $\underline{C}_c$ is based on a rate-$\frac{3}{4}$ convolutional encoder and the four-dimensional partition $Z^4/2Z^4$. This code adds one redundant bit every four dimensions ($N=4$, $r_c=1$). On the other hand, the code $\underline{C}_s$ is derived from the mod-2 trellis code $\underline{C}$ which is based on a rate-$\frac{1}{2}$ binary convolutional encoder and the two-dimensional partition $Z^2/2Z^2$. Equivalently, $\underline{C}$ can be described by a rate-2/4 convolutional encoder and the four-dimensional partition $Z^4/2Z^4$ ($N=4$, $k_s=2$). In this form, $\underline{C}$ has the 4D time-zero lattice $RZ^4$. To send 6.5 bits per symbol using these codes, we would pick $\underline{C}_s=8\underline{C}$ such that it is based on the partition $8Z^4/16Z^4$, with time-zero lattice $8RZ^4$. Then $|\Lambda_c/\Lambda_{0s}|=|Z^4/8RZ^4|=2^{14}=2^{2 \times 6.5+1}=2^{2\beta+r_c}$. On the other hand, to send 7.5 bits/symbol, we would pick $\underline{C}_s=8\,R\underline{C}$ such that it is based on the partition $8RZ^4/16RZ^4$, with time-zero lattice $16Z^4$. Then $|\Lambda_c/\Lambda_{0s}|=|Z^4/16Z^4|=2^{2 \times 7.5+1}=2^{16}$.

Figure 2:
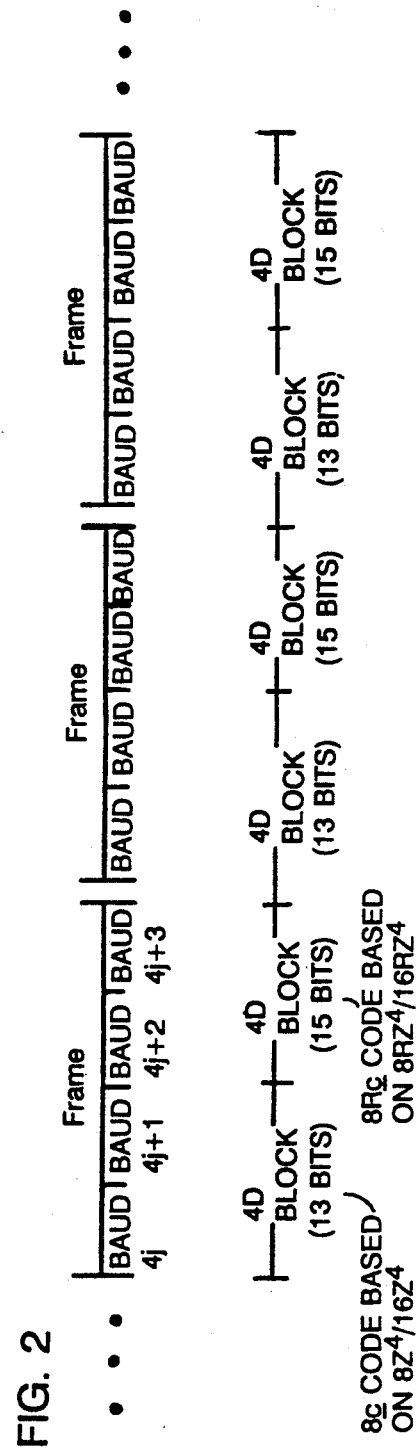
FIG. 2 is a framing scheme.
Figure 3:
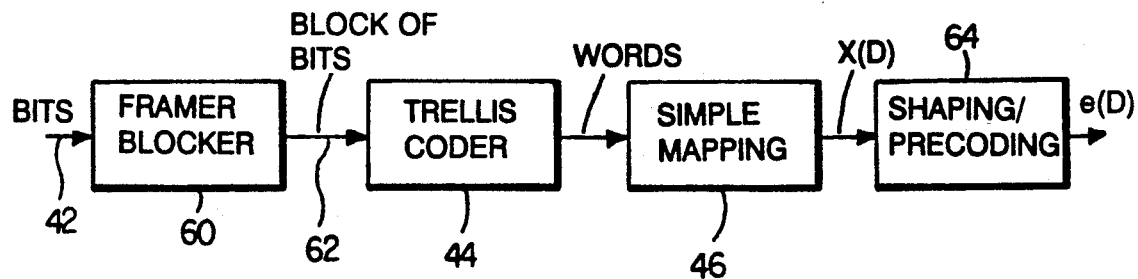
FIG. 3 is a block diagram of an alternatively sealed trellis code transmitter.

Thus, referring to FIG. 2, we can send an average of 7 bits/symbol (i.e., 7 bits/baud) by using a frame of 4 bauds or $L=2 \times 4=8$ dimensions, and by sending 13 and 15 bits in alternate 4D blocks using respectively the $8Z^4/16Z^4$ and the $8RZ^4/16RZ^4$ based codes for shaping. Referring to FIG. 3, the alternating of codes is achieved by including in the transmitter a framer-blocker 60 which assembles the bits into frames and organizes the frames into blocks 62.

Figure 4:
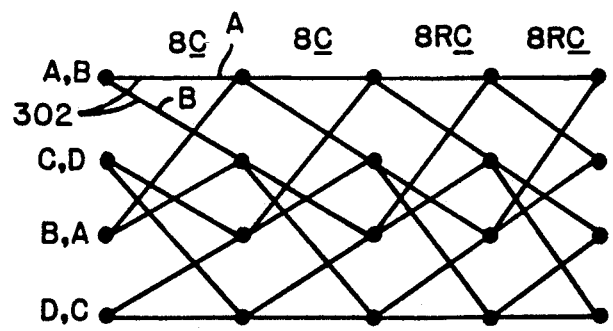
FIG. 4 is a trellis diagram.

Every two bauds, the coding code $\underline{C}_c$ will output the two symbols ($x_{2k}$ and $x_{2k+1}$) and these would be processed by the precoder which will operate on a 2D trellis representation of the trellis code $\underline{C}_s$. Referring to FIG. 4, for the first two bauds of the frame, this trellis corresponds to the trellis of the code 8C, whereas for the next two bauds, it corresponds to the trellis of the code 8RC. The decoder will search through this time-varying trellis to find a sequence $c_s(D)$.

FILTERED TRELLIS CODES

The time varying trellis code discussed in the preceding section is subjected to a filtering process to form a filtered trellis code in the same manner as described in the trellis precoding patent application cited above. This is accomplished in the shaping/precoding operation 48 in FIG. 1. More specifically, we seek a $c_s'(D)$ that minimizes $\|e(D)\|^2 = \|x'(D) - c_{s'(D)}\|^2$, where $c_s'(D)$ (58 in FIG. 1) is any sequence of the form $c_s(D)g(D)$, $c_s(D) \in \underline{C}_s$. We call the set of all such $c_s'(D)$ the filtered trellis code $\underline{C}_s' = \underline{C}_s g$. To implement trellis precoding, we need a minimum mean-squared error (MMSE) decoder for $\underline{C}_s$.

Even if $\underline{C}_s$ can be represented by a finite-state trellis, however, $\underline{C}_s'$ in general cannot. Indeed, if $s_k$ is the state of an encoder that generates a code sequence $c_s(D) \in \underline{C}_s$ at time k, then the state of the sequence $c_s'(D) = c_s(D)g(D)$ at time k is $s_k' = [s_k; p_k]$, where $p_k = [c_{s,k-1}, c_{s,k-2}, \ldots]$ represents the state of the 'channel' whose response is $g(D)$. The number of possible values of $p_k$ is not finite, even if $g(D)$ has finite degree, because the set of possible code symbols $c_{s,k-i}$, $i=1,2,\ldots$, is a coset of a lattice and thus has infinitely many elements. Therefore, in general, an MMSE decoder for $\underline{C}_s'$ cannot be realized by a trellis search.

REDUCED-STATE DECODERS FOR FILTERED TWO-DIMENSIONAL TRELLIS CODES

We now show how to construct a class of near optimum 'reduced-state' trellis decoders for $\underline{C}_s'$, using reduced-state sequence estimation (RSSE) principles.

In this section, we shall assume that $\underline{C}_s$ is a two-dimensional trellis code derived from a scaled, rotated version of some 2D code $\underline{C}$ which is based on the partition $\Lambda/\Lambda' = Z^2/R^{k_s+r_s}Z^2$; these codes can be represented by trellises that have $2^{k_s}$ transitions per branch where each branch is associated with a unique coset of a scaled, rotated version of $R^{k_s+r_s}Z^2$. In what follows, we will denote the partition used at time k as $\Lambda_{s,k}/\Lambda'_{s,k}$, $k=1,\ldots,L/2$. In the next section, we will show how the method may be extended to higher-dimensional trellis codes. It will be apparent that two-dimensional codes are the most natural ones to use when $g(D)$ is a complex-valued response.

Two relevant principles of reduced-state sequence estimation are, first, to keep track only of the last K code symbols $c_{s,k-i}$, $1 \leq i \leq K$, even when the filter response $q(D)$ has degree greater than K, and second, to keep track of $c_{s,k-i}$ only with respect to its membership in one of $|\Lambda_{s,k-i}/\Lambda_k(i)| = 2^{j_i} = J_i$ cosets $\Lambda_k(i) + a(c_{s,k-i})$ of some lattice $\Lambda_k(i)$. The sequence of lattices, $\Lambda_k(i)$ must satisfy the property that $j_i$, $i=1,\ldots,K$, is a non-increasing sequence so, as a code symbol $c_{s,k-i}$ becomes less recent, the information that is kept about it becomes coarser and coarser, until it is forgotten altogether (at $i=K$).

A code symbol $c_{s,k-i}$, $1 \leq i \leq K$, in $\Lambda_{s,k-i}$ belongs to one of $J_i$ cosets of $\Lambda_k(i)$. We denote this coset by $a(c_{s,}$ $k-i$). Then, the 'coset state' of a code sequence $c'_s(D) = c_s(D)g(D)$ at time k can be defined as $t_k = [a(c_{s,k-1}), \ldots, a(c_{s,k-K})]$.

Next we concatenate coset states $t_k$ with encoder states $s_k$ to obtain 'super-states' $v_k$:

$$v_k = [s_k; t_k] = [s_k; a(c_{s,k-1}), \ldots, a(c_{s,k-K})].$$

Note that given the current state $v_k$ and the code symbol $c_{s,k}$, the next state $v_{k+1}$ is uniquely determined. The uniqueness is guaranteed by the condition that $J_i$ is a non-increasing sequence.

Figure 5:
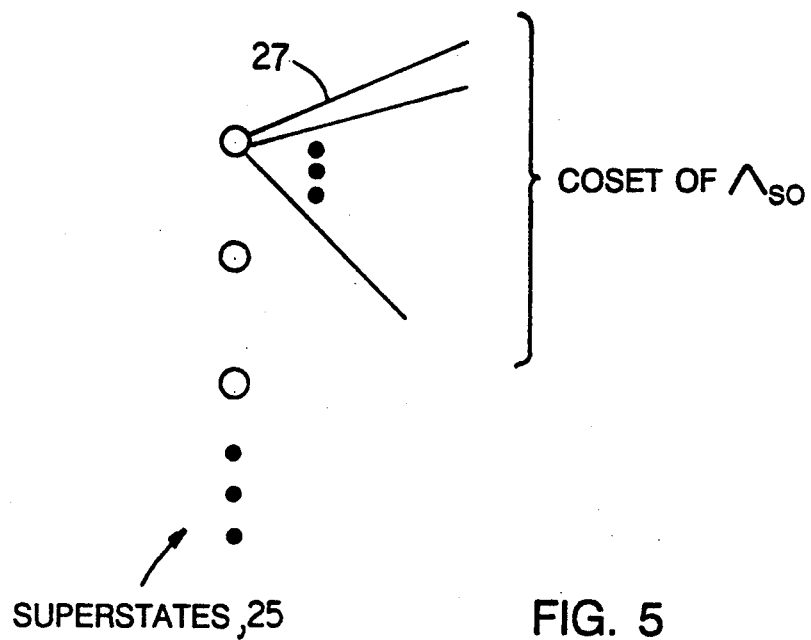
FIG. 5 is a reduced state trellis.

Referring to FIG. 5, the super-states define a reduced state trellis, which we sometimes call a super-trellis. In this trellis, signal points associated with all branches 27 leaving a super-state 25 belong to a coset of the time-zero lattice $\Lambda_{s0,k}$. If $\Lambda_{s,k}'$ is a sublattice of $\Lambda_k(1)$, then as in the ordinary trellis there are $2^{k_s}$ branches leaving any super-state, each associated with one of the $2^{k_s}$ cosets of $\Lambda_{s,k}'$ whose union is the given coset of $\Lambda_{s0,k}$. If $\Lambda_k(1)$ is a sublattice of $\Lambda_{s,k}'$, on the other hand, then there is a branch for each of the $2^{j_1-r_s}$ cosets of $\Lambda_k(1)$ whose union is the given coset of $\Lambda_{s0,k}$.

The number of possible values that $v_k$ can take is finite. In fact, if $\Lambda_k(i)$ is a sublattice of $\Lambda_{sk}'(j_i \geq k_s + r_s)$ for all $i < K$, and $\Lambda_k(K)$ is a sublattice of $\Lambda_{s0,k}$ ($j_K \geq r_s$), then the total number of super-states is given by $$S' = S\pi_{1 \leq i \leq K} 2^{j_i - r_s}.$$

Having described the reduced-state trellis, we now show how the Viterbi algorithm is used to search these trellises. Let $g(D) = g_K(D) + g_\infty(D)$, where $g_K(D) = 1 + g_1 D + \ldots + g_K D^K$ is the polynomial corresponding to the first K+1 terms of $g(D)$, and $g_\infty(D)$ is a residual component of possibly infinite span. Let $g_\infty(D) = g_N(D)/g_D(D)$, where $g_N(D)$ and $g_D(D)$ are both finite-order polynomials. Then $g_N(D)$ has the same delay as $g_\infty(D)$, whose delay is at least K+1.

Figure 6:
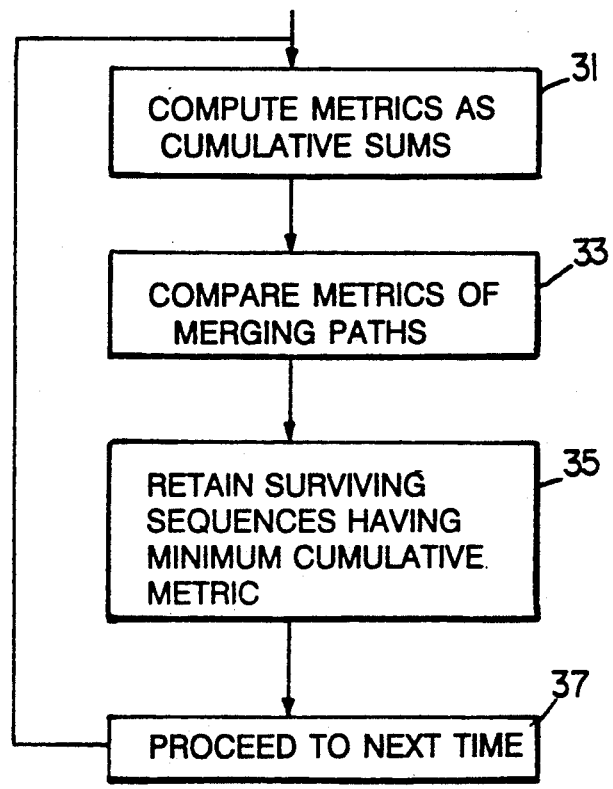
FIG. 6 is a diagram of the steps of a Viterbi algorithm.

Suppose that the input to the reduced state decoder is $x'(D)$. Referring to FIG. 6, let us define the Euclidean distance path metric of a code sequence $c_s'(D)$ at a given time k as the cumulative sum $$\Gamma_k = \Sigma_{j \leq k} \gamma_j$$

of the branch metrics $\gamma_j, j \leq k$, computed (31) according to $$\gamma'(D) = \|x'(D) - c_s'(D)\|^2 = \|x(D) - c_s(D)g_K(D) - w(D)\|^2$$

where $w(D) = c_s(D)g_\infty(D)$, which means that $w(D)$ satisfies $$w(D) = -w(D)[g_D(D) - 1] + c_s(D)g_N(D),$$

with $w_k = 0$, for $k \leq 0$. Note that $[g_K(D) - 1]$, $g_N(D)$, and $[1 - g_D(D)]$ all have a delay of at least 1; the Viterbi algorithm (VA) can proceed in a recursive manner 37 by comparing metrics (33) of merging paths and retaining 35 the surviving sequences with minimum path metrics. Therefore, the VA needs to store the $w_k$'s for every surviving path. It should be noted that even though only K terms of the filter response $g(D)$ are taken into account in the trellis construction, its entire memory is included in the branch metric computations.

Among these reduced-state decoders, there is one that particularly stands out in terms of its tradeoff of performance against complexity. This is the special case of parallel decision-feedback decoding (PDFD), where the reduced-state trellis is simply the trellis of the original code $C_s$. This is obtained by setting $K=0$. The PDFD decoder is the simplest in this class, and its performance is the poorest, although it often performs close to the optimum decoder.

A practical VA has a finite decoding delay M. We can assume that it effectively makes a decision on the kth symbol $c_{s,k}$ based on observations $x_k, x_{k+1}, \ldots, x_{k+M}$, assuming the correct node at time k is $v_k$. (Under this assumption the VA will always select a true code sequence.) For $M=0$, such a decoder becomes a simple decision-feedback decoder (DFD), where in every symbol interval the decoder performs filtering using past decisions, and operates like a hard-decision decoder by selecting the closest signal point $c_k$ appropriate coset of $\Lambda_{s0,k}$ using a MMSE decoder for $\hat{\Lambda}_{s0,k}$. Clearly in this case, regardless of the channel response, the error sequence will always lie in $[R_V(\Lambda_{s0,k})]^\infty$, where $R_V(\Lambda_{s0,k})$ is the Voronoi region of the time-zero lattice $\Lambda_{s0,k}$, and the average power of these regions will determine the average power of the transmitted symbols. Since $\Lambda_{s0,k}$ may be time-varying, the size of the signal constellation boundary may be time-varying also. This may translate into a higher peak-to-average ratio. However, this will be controlled by putting constraints into the decoder as will be explained later.

The error sequence $e(D)=x(D)-c_s(D)$ will lie in some decision region of the RSSE decoder for the filtered trellis code $C_s'$. The average power of this region will essentially determine the shaping gain that can be achieved. This region, and thus the shaping gain will generally depend on the interaction between the shaping code $C_s$ and the filter g(D), as we have seen with MMSE decoders.

In practice, we can measure the shaping gain of an error region as follows. We take an input sequence x'(D), which is uniformly distributed in some simple fundamental region of $C_s'$. We decode it and obtain an error sequence e(D). This sequence will be uniformly distributed in the common error region of the decoder. The output mean-squared error (MSE) gives the shaping gain. For $M=0$, we get the shaping gain of the regions $R_V(\Lambda_{s0,k})$, $k=1, \ldots, L/2$. As M is increased towards infinity, the error region will change and the output MSE will monotonically decrease towards a limit which depends on the reduced-state trellis being used.

REDUCED-STATE DECODERS FOR FILTERED MULTIDIMENSIONAL TRELLIS CODES

We now extend these reduced-state decoding methods to higher dimensional $(N>2)$ trellis codes $C_s$, such as the dual Wei codes. The dual Wei codes are duals of the Wei codes of the kind disclosed in Wei, "Trellis-Coded Modulation with Multidimensional Constellations," IEEE Trans. Inform. Theory, Vol. IT-33, pp. 483–501, 1987, incorporated herein by reference. These codes are 'mod 2' trellis codes, which can always be regarded as being based upon the lattice partition $\Lambda_s/\Lambda_s' = Z^N/2Z^N$, and on some rate k/N binary convolutional code C that selects cosets of $2Z^N$ in $Z^N$. These cosets can be specified by N/2 cosets of $2Z^2$ in $Z^2$.

It follows that the N-dimensional trellis code can be represented by a two-dimensional trellis, which is periodically time-varying with period N/2. At times nN/2, the trellis has S states and $2^m$ branches per state as in the original N-dimensional trellis, whereas at intermediate times $(kN/2)+j$, $j=1, 2, \ldots, (N/2-1)$, the number of states may be larger, where the exact number of states depends on the specific code in use.

Figure 7:
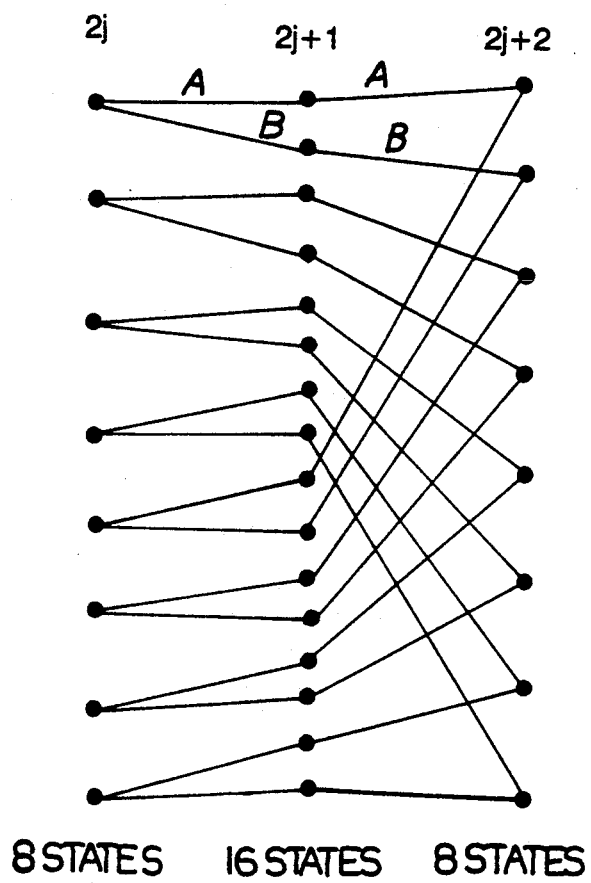
FIG. 7 is a trellis for a Wei code.

As an example, consider the 4D 8-state dual Wei code, which can be viewed as a period-2, time-varying trellis code based on the partition $Z^4/2Z^4$ and a rate-$\frac{1}{4}$ convolutional encoder. This trellis is illustrated in FIG. 7. Note that there are 8 states at even times, with 2 distinct branches leaving each state, and there are 16 states at odd times, with one branch leaving each state.

Once a two-dimensional trellis is obtained, reduced state decoders can be defined as in the previous section. The operation of the VA is then similar, except it has to account for the additional time-varying nature of the trellis.

CONSTRUCTION OF THE DISCRETE-TIME CHANNEL MODEL

So far, we have assumed a canonical discrete-time channel model described by $$r(D)=e(D)h(D)+n(D)$$

where e(D) is a complex input sequence, h(D) is a complex, stable, causal response with $h_0=1$ and n(D) is a white Gaussian noise component which is independent of e(D). For best results we will choose h(D) to be minimum phase. In practice, the physical channel will rarely obey this canonical model; the channel response is often nonminimum-phase, the noise can be correlated and, furthermore, the physical channel is often continuous-time. Therefore, referring to FIG. 8, in practice, the physical channel 201 is often augmented by linear transmitter and receiver filters 202,204 in the transmitter and in the receiver, respectively, to construct a discrete time channel 205 that obeys the canonical model.

In addition to providing the canonical discrete-time channel, it is desirable that these filters also help optimize the performance of the trellis precoder. It has been shown in the case of Tomlinson precoding that the optimum transmitter filter has a brickwall (or flat) spectrum within the Nyquist band (for continuous-time channels this result holds under certain mild conditions (Price, "Nonlinearly Feedback Equalized PAM versus Capacity for Noisy Filtered Channels," Proc. ICC-72, June, 1972, supra)); the optimum receiver filter, on the other hand, consists of a matched filter sampled at the baud rate (and at the optimum sampling phase), followed by a discrete time noise whitening filter that produces a minimum-phase combined response h(D) (Price, supra). This noise-whitening filter can be described by the cascade of a zero-forcing linear equalizer and a minimum-phase linear prediction (error) filter for the residual noise sequence appearing at the output of the linear equalizer. The prediction filter represents the channel model h(D).

In practice, it may sometimes be preferable to allow the overall discrete-time channel to deviate from the canonical model to arrive at a better trade-off between ISI and noise. For example, the selection of the filter may be based on the output MSE. Of course, due to the presence of ISI, minimum MSE does not guarantee minimum error probability. Nevertheless, this criterion is often used in practice because of ease in adaptive implementation, and because it is believed that often (if not always) it leads to lower error probability, particularly at low SNR. Under the MSE criterion, the optimum transmitter spectrum is different; it has the 'water-pouring characteristic' found in information theory (J. Salz, "Optimum mean-squared error decision feedback equalization," BSTJ, vol. 52, pp. 1341-1373, 1973). For the moderate or high SNR's found on telephone lines, however, a 'water-pouring spectrum' can be closely approximated by a brickwall spectrum. The minimum MSE receiver filter also consists of a matched filter sampled at the baud rate and a discrete-time filter that produces a white residual error sequence. The whitening filter can now be represented by the cascade of a MSE linear equalizer and a prediction error filter for the error sequence (ISI+noise) that appears at the output of that equalizer.

Under the MSE criterion, the received sequence can be written as $r(D)=e(D)h(D)+n'(D)$, where the error sequence $n'(D)$ is now signal-dependent and possibly non-Gaussian; the trellis precoder can still operate in the same manner. Here, it may be helpful to note that with an optimum transmitter filter, the overall response $h(D)$ is independent of the SNR (in fact, it is the same filter that we obtain under the no ISI criterion.)

In practice, the combination of the matched filter and the MSE linear equalizer can be implemented as a digital transversal equalizer with a fractional tap-spacing of T/M, where T is the baud interval and M is chosen sufficiently large to avoid aliasing. Since the characteristics of the physical channel is often unknown, an adaptive training algorithm is needed to learn this equalizer. This can be accomplished by transmitting a known training sequence such as a pseudo-noise (PN) sequence modulating a QPSK signal structure prior to data transmission, and then using a least-mean square (LMS) algorithm (J. Proakis, "Digital Communications," McGraw-Hill, 1983). Once the equalizer is learned, an adaptive minimum MSE linear predictor can be realized. This predictor has a tap-spacing of T and it whitens the residual error sequence. Its steady state coefficients form the desired channel response $h(D)$ of the model. So far, we have implicitly assumed that all filters are infinitely long. Of course, in practice, the linear equalizer and the predictor are implemented with finite length filters; nevertheless, when these are sufficiently long the general discussion presented above will approximately apply.

After a sufficiently long training period, the information about $h(D)$ is passed back to the transmitter for use during trellis precoding. During data transmission an adaptive algorithm may continue to adjust the coefficients of the linear equalizer to track small variations in the channel response. However, the prediction filter is kept fixed. It is conceivable to update the predictor as well, provided that this information can be relayed back to the transmitter using a 'service channel' and proper synchronization between the transmitter and the receiver can be maintained. Alternatively, the receiver may monitor the true current values of the prediction filter coefficients and may request a new training signal if the discrepancy becomes excessive.

MODEM IMPLEMENTATION

One application of trellis precoding is to a voiceband modem operating at a baud rate of 2743 symbol/s and a bit rate of 19.2 kb/s, thus sending 7 bits/baud. The transmitter and the receiver are implemented mostly in digital form.

The transmitter 102 and the receiver 104 of such a modem are shown respectively in Figs. 9, 10. Based on the optimality discussion above, the transmitter filter 106 is chosen to have a square-root-of-raised-cosine characteristics with a small excess bandwidth ($\leq 12\%$), thus approximating a brickwall spectrum. During training, a known pseudo-random four-point QAM sequence $107 \times (D)$ is transmitted via train/data switch 105 for a sufficiently long period of time to allow the receiver to learn first its adaptive equalizer 108 and subsequently its adaptive prediction filter 110. The complex output of the transmitter filter is modulated to a carrier frequency $w_c$ (radians/s) and the real part of the modulated signal is D/A converted, filtered by an analog filter, and transmitted over the channel, all by unit 107. In the receiver 104, the received signal is filtered by an analog filter 109 and then A/D converted at a sufficiently high nominal sampling rate M/T (the sampling phase is controlled by a timing recovery circuitry). The sequence of digital samples $z_n$ is fed into an equalizer delay line 108 with a tap spacing of T/M, where n is the sampling index.

To describe the operation of the adaptive receiver, we denote the complex coefficients of the linear equalizer as $c_n$, $-N_1 \leq n \leq N_2$ ($N_1+N_2+1$ taps). The output of the equalizer is computed once every baud; then, it is demodulated to obtain the sequence $r_k'$. We assume that all coefficients are initially set to zero. The initial values may also be determined using a fast initialization method such as the scheme described in (Chevillat et al., "Rapid Training of a Voice-band Data Modem Receiver Employing an Equalizer with Fractional T spaced Coefficients, IEEE Trans. Commun., vol. COM-35, pp. 869-876, Sept. 1987). In any case, the coefficients of the linear equalizer are adjusted according to $c_{n,k+1}=c_{n,k}-\alpha\epsilon_k z_n^*$, $n=-N_1, \ldots, 0, \ldots, N_2$ where $\epsilon_k = r_k' - x_k$ is the error between the equalizer output $r_k'$ and the known transmitted symbol $x_k$, and k is the index for the baud interval. If the step size $\alpha$ is sufficiently small, then the coefficients will converge to values which minimize the MSE. Furthermore, if $N_1$ and $N_2$ are sufficiently large, the filter converges to the optimum MSE linear equalizer that we described earlier.

Once the equalizer has converged, its outputs $r_k'$ are fed into a T-spaced prediction (error) filter with coefficients $h_0=1$ (fixed), $h_1$, and $h_2$. This filter produces $r(D)$, the output of the channel model. Its coefficients are updated according to $$h_{i,k+1} = h_{i,k} - \beta \epsilon^*_{k-i} \epsilon'\text{hd } k, \ i=1,2$$

where $\epsilon'_k = r_k - x_k - x_{k-1}h_{1,k} - x_{k-2}h_{2,k}$ is the final error after prediction and $\beta$ is another small step size. Again, when $\beta$ is sufficiently small, these coefficients will converge to their values which minimize the MSE. If the overall channel model can be represented by a three coefficient model as we assumed here, we expect the residual error sequence to be approximately white, as explained earlier.

After convergence, the coefficients $h_1$ and $h_2$ are sent back to the transmitter for use during trellis precoding. This can be accomplished, for example, by simply encoding the coefficients into binary words and transmitting these using 4-QAM signaling. These words are typically sent in a small frame which has a flag for recognizing the start of the frame and an error control check to detect transmission errors. In what follows, we denote the estimated channel response by $h(D)$, and its formal inverse by $g(D)$.

During transmission of actual data from a data terminal equipment (DTE) 120, the prediction filter 110 is kept fixed, but the linear equalizer 108 is continually adapted in a decision-directed mode to track small channel variations. (It is also possible to update the prediction filter along with the precoder coefficients. The latter would be updated using a side channel.) Because of trellis precoding, it is not possible to generate the error signal $\epsilon_k$ directly at the equalizer output, since decisions are available at the output of the prediction filter 110 h(D). Therefore, to reconstruct the equalizer error, the final prediction error $e'_k = r_k - Y_k'$ between the output $r_k$ of the prediction error filter and the estimated channel symbol $Y_k'$ is passed through g(D) 122. The estimates $Y_k'$ can be obtained with no delay using a simple slicing operation, or they can be obtained from the Viterbi decoder, albeit after some delay. Experiments indicate that this structure operates reliably even in the presence of decision errors.

Referring again to FIG. 9, in the trellis precoder 124 we use a four-dimensional 16-state Wei code for coding (denoted as $\underline{C}_c$) and a two-dimensional 4-state Ungerboeck code for shaping (denoted as $\underline{C}_s$). and we send 7 bits per two dimensions (or baud). The code $\underline{C}_s$ is derived from trellis code $\underline{C}$ which is based on a rate-½ 4-state binary convolutional encoder and the two dimensional partition $Z^2/2Z^2$. Equivalently, $\underline{C}$ can be described by a rate-2/4 convolutional encoder and the four-dimensional partition $Z^4/2Z^4$. We use a four baud frame to define $\underline{C}_s$, where in the first two bauds $\underline{C}_s = 8\underline{C}$ and the next two bauds $\underline{C}_s = 8R\underline{C}$, as described earlier. Thus, the time zero lattice is $8RZ^4$ during the first two bauds and $16Z^4$ during the next two bauds of the frame. The code $\underline{C}_c$, on the other hand, is based on a rate-¾ binary convolutional encoder and the 4 D partition $Z^4/2Z^4$. This code adds one redundant bit every four dimensions (or equivalently, every two bauds). Note that a fundamental region of the time zero lattice $8RZ^4$ will contain exactly $2^{2 \times 6.5 + 1} = 2^{14}$ points from any coset of the lattice $Z^4$; i.e., $|Z^4/8RZ^4| = 2^{14}$, and a fundamental region of the time zero lattice $16Z^4$ will contain $2^{2 \times 7.5 + 1} = 2^{16}$ points from any coset of $Z^4$.

A small buffer 130 is filled with bits received from the DTE at the rate of 7 bits per (2D) signaling interval. Referring also to FIG. 2, during the two bauds, 4j and 4j+1 [the two bauds 4j+2, 4j+3] a scrambler 132 takes 7 [8] and then 6[7] bits from this buffer, respectively. The scrambled bits are delivered to a binary encoder in groups of 13 [15] so-called I bits, labeled I6(4j) through I0(4j) and I5(4j+1) through I0(4j+1) [I7 (4j+2) through I0(4j+2) and I6(4j+3) through I0(4j+3)], at two successive times 4j and 4j+1[4j+2 and 4j+3].

Figure 11:
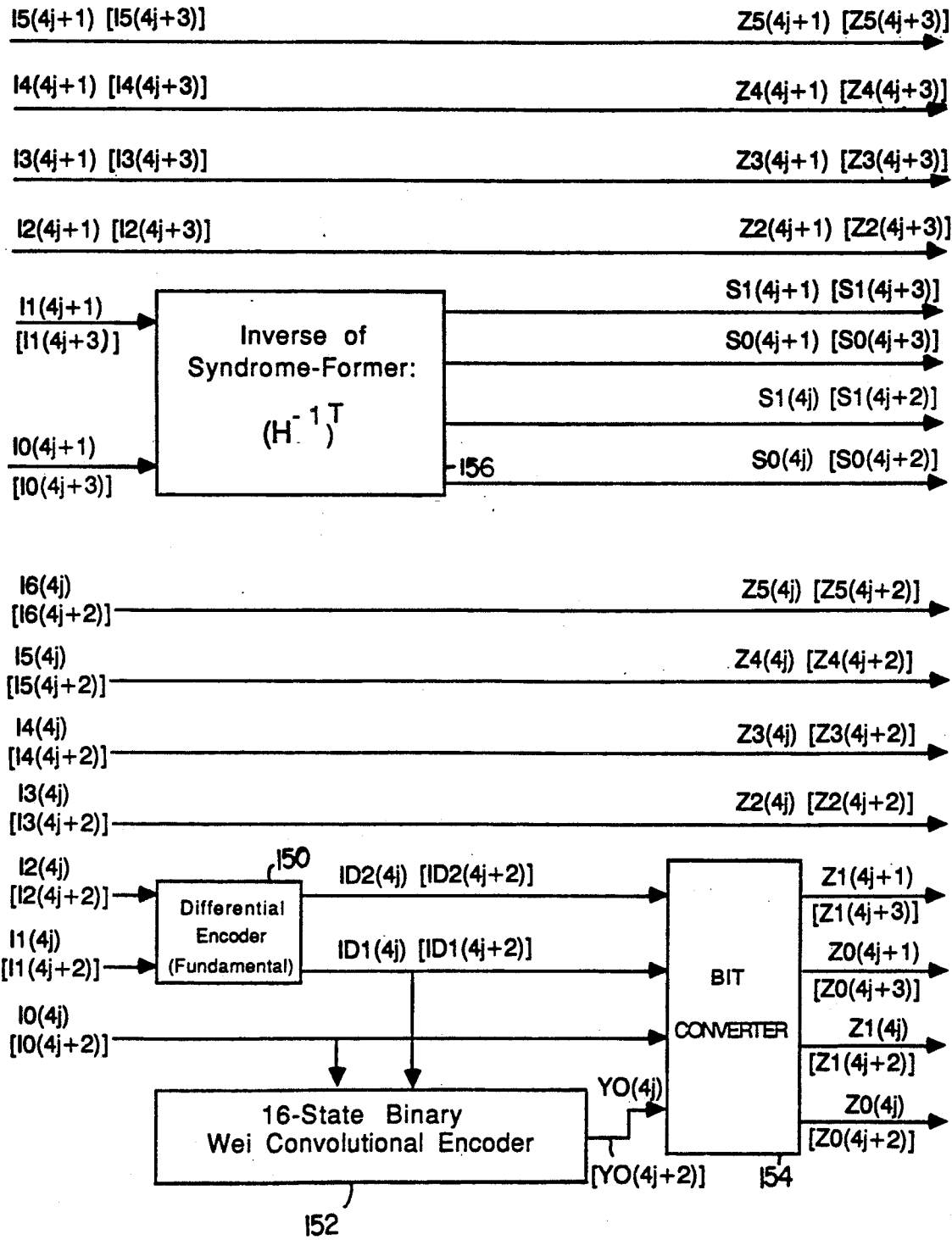
FIG. 11 is a block diagram of binary encoding for trellis precoding.

Referring to FIG. 11, the I-bits I2(4j)I1(4j) [I2(4j+2) I1(4j+2)] are taken to represent an integer mod 4 and are differentially encoded by a coding differential encoder 150 to produce two differentially encoded bits ID2(4j)ID1(4j) ID2(4j+2)ID1(4j+2)] according to the relation ID2(4j)ID1(4j) I2(4j)I1(4j)+₄ID2(4j-2)ID1(4j-2)

[ID2(4j+2)ID1(4j+2)=I2(4j+2)I1(4j+2)-
⊕₄ID2(4j)ID1(4j)]

where $\oplus_4$ represents mod-4 addition.

Figure 12:
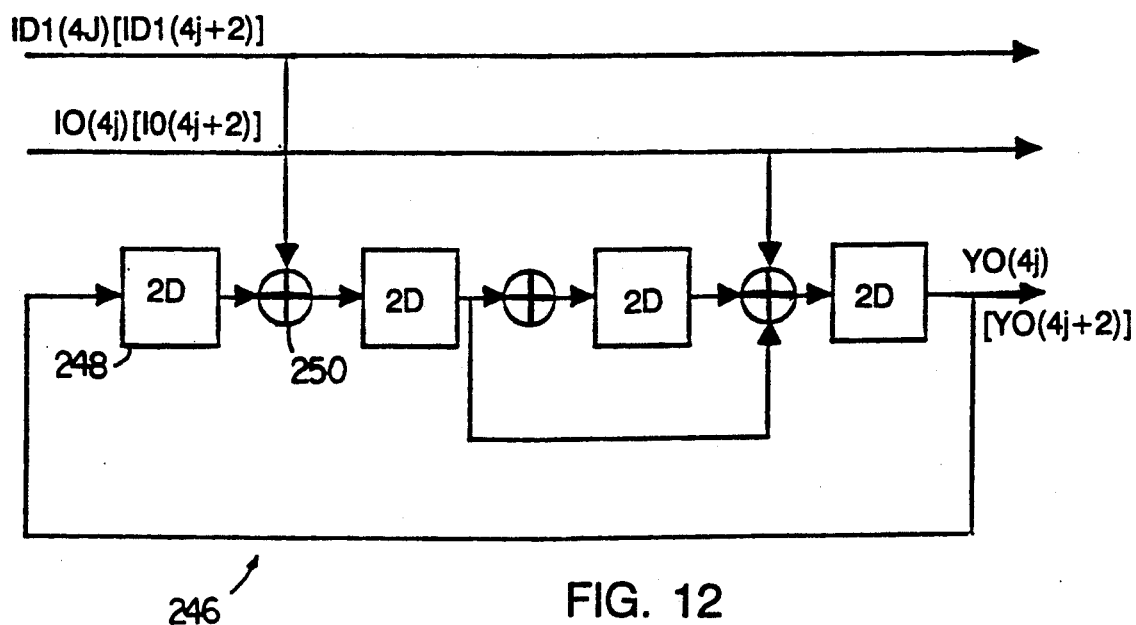
FIG. 12 is a block diagram of a Wei binary convolutional encoder.

The bits ID1(4j) and I0(4j) [ID1(4j+2) and I0(4j+2)] enter a rate ⅔, 16 state binary convolutional encoder 152, which produces one redundant bit Y0(4j) [Y0(4j+2)]. Referring to FIG. 12, this encoder includes a sequential circuit 246 having four delay-2 shift registers 248 and three mod-2 adders 250. (This encoder can also be realized using other circuits.)

Referring again to FIG. 11, the bits ID2(4j)ID1(4j) I0(4j) [ID2(4j+2)ID1(4j+2)I0(4j+2)]and the redundant bit Y0(4j) [Y0(4j+2)] enter a bit converter 154 that generates four output bits Z1(4j)Z0(4j)Z1(4j+1)Z0(4j+1) [Z1(4j+2)Z0(4j+2)Z1(4j+3)Z0(4j+3)] according to the following table. Note that the corresponding bracketed headings for the table are [ID2(4j+2) ID1(4j+-2)I0(4j+-2)Y0(4j+2)Z1(4j+3)Z0(4j+3)Z1(4j+2)Z0(4j+2)]:

| ID2(4j) | ID1(4j) | I0(4j) | Y0(4j) | Z1(4j+1) | Z0(4j+1) | Z1(4j) | Z0(4j) |
|---|---|---|---|---|---|---|---|
| 0 | 0 | 0 | 0 | 0 | 0 | 0 | 0 |
| 0 | 0 | 0 | 1 | 1 | 0 | 0 | 0 |
| 0 | 0 | 1 | 0 | 0 | 1 | 0 | 0 |
| 0 | 0 | 1 | 1 | 1 | 1 | 0 | 0 |
| 0 | 1 | 0 | 0 | 1 | 0 | 1 | 0 |
| 0 | 1 | 0 | 1 | 0 | 1 | 1 | 0 |
| 0 | 1 | 1 | 0 | 1 | 1 | 1 | 0 |
| 0 | 1 | 1 | 1 | 0 | 0 | 1 | 0 |
| 1 | 0 | 0 | 0 | 0 | 1 | 0 | 1 |
| 1 | 0 | 0 | 1 | 1 | 1 | 0 | 1 |
| 1 | 0 | 1 | 0 | 0 | 0 | 0 | 1 |
| 1 | 0 | 1 | 1 | 1 | 0 | 0 | 1 |
| 1 | 1 | 0 | 0 | 1 | 1 | 1 | 1 |
| 1 | 1 | 0 | 1 | 0 | 0 | 1 | 1 |
| 1 | 1 | 1 | 0 | 1 | 0 | 1 | 1 |
| 1 | 1 | 1 | 1 | 0 | 1 | 1 | 1 |

These output bits are used to select one of 16 cosets of $2Z^4$ whose union is the four-dimensional grid $Z^4 + (0.5, 0.5, 0.5, 0.5)$. Each such coset is represented by a pair of cosets of $2Z^2$ in the two-dimensional grid $Z^2 + (0.5, 0.5)$. These are selected individually by Z1(4j)Z0(4j) and Z1(4j+1)Z0(4j+1)[Z1(4j+2)Z0(4j+2) and Z1(4j+3)Z0(4j+3)].

The remaining I-bits I3(4j) through I6(4j) [I3(4j+2) through I7(4j+2)] pass through unchanged and are relabeled as Z2(4j) through Z5(4j) [Z2(4j+2) through Z6(4j+2)]. They are combined with Z1(4j)Z0(4j) [Z1(4j+2)Z0(4j+2)] to form the six-tuple Z5(4j)Z4(4j) ... Z0(4j) [seven-tuple Z6(4j+2)Z5(4j+2)...Z0(4j+2)]. Similarly, the I bits I2(4j+1) through I5(2j+1) [I2(4j+3) through I6(4j+3)] together with Z1(4j+1)Z0(4j+1) [Z1(4j+3)Z0(4j+3)] form the six-tuple Z5(4j+1)Z4(4j+1) ... Z0(4j+1) [seven-tuple Z6(4j+3)Z5(4j+3) ... Z0(4j+3)].

The I-bits I1(4j+1)I0(4j+1) [I1(4j+3)I0(4j+3)]sequentially enter a rate-½ inverse syndrome former $(H^{-1})^T$ 156. H is a syndrome former of the binary code C defined above. Referring to FIG. 14, $(H^-)^T$ produces two pairs of S bits S1(4j)S0(4j) [S1(4j+2)S0(4j+2)]and S1(4j+1)S0(4j+1) [ S1(4j+3)S0(4j+3)]. As discussed earlier and disclosed in Forney and Eyuboglu, Trellis Shaping for Modulation Systems, United States Patent Application cited above, $(H^{-1})^T$ is the left inverse of $(H)^T$ discussed below, and is included to limit error propagation.

Figure 13A:
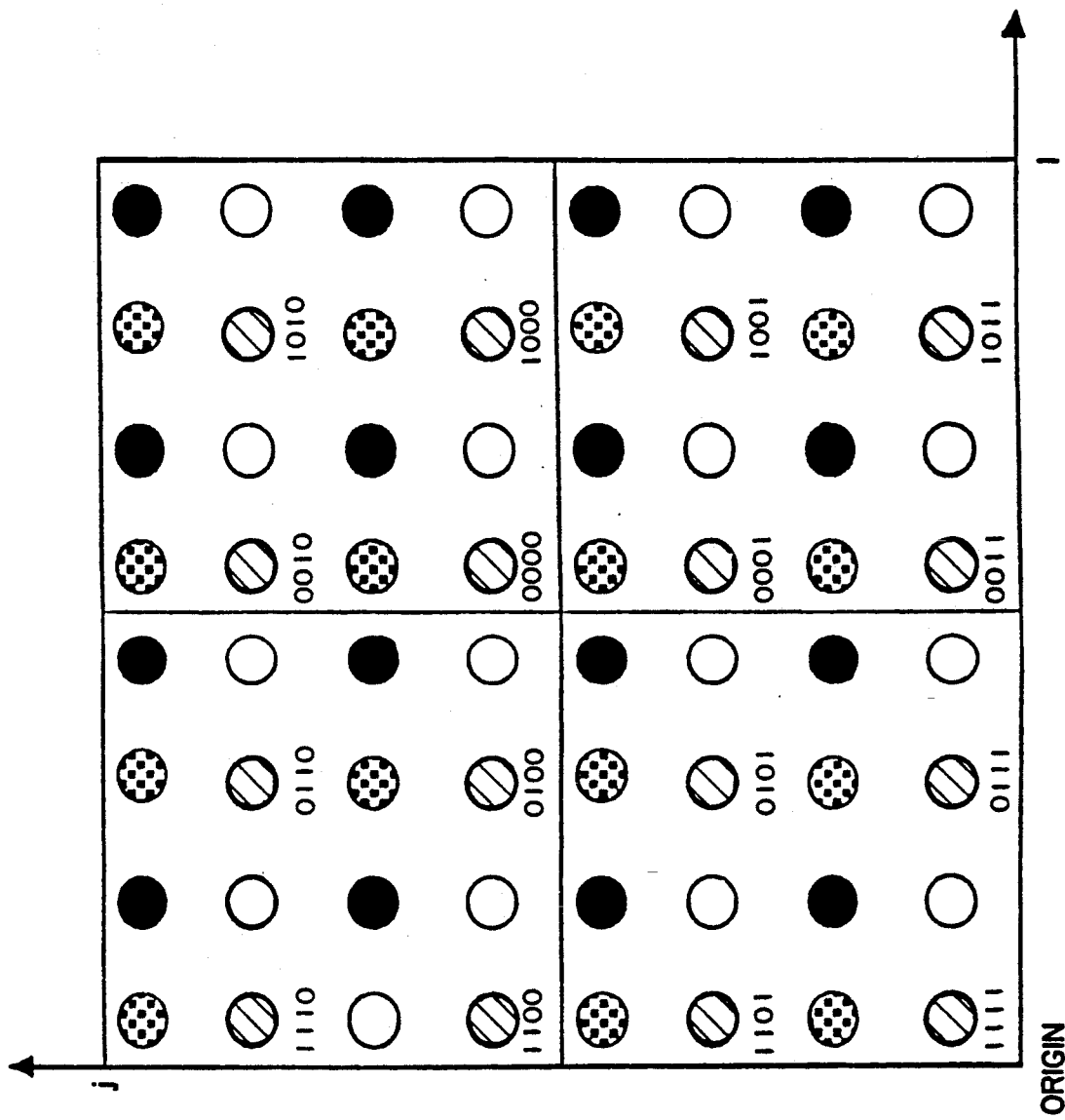
FIGS. 13A, 13B are diagrams of quadrants of signal sets.
Figure 13B:
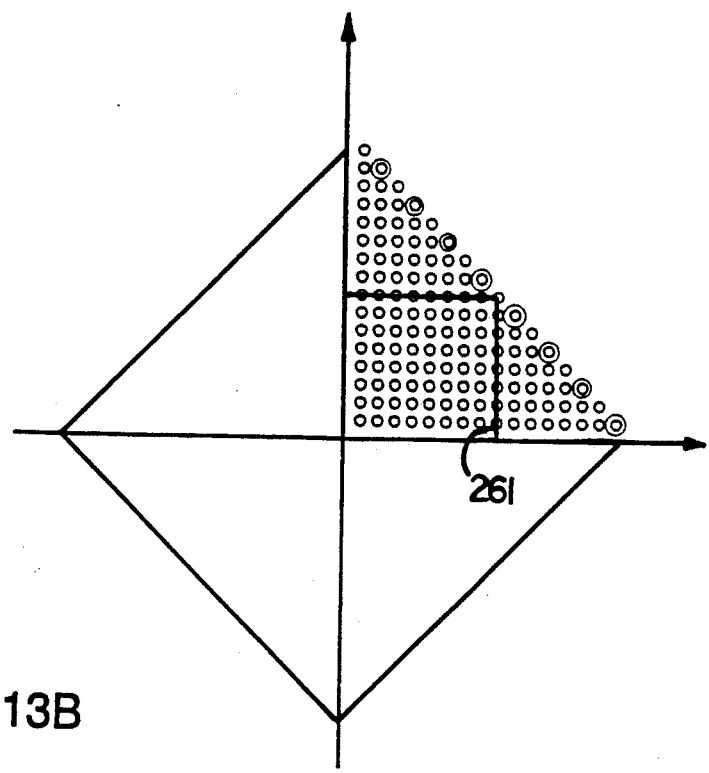

Referring to FIGS. 13A, 13B during the two bauds 4j and 3j+1 [4j+2 and 4j+3], the 16bits [18-bits] generated in this manner are mapped into two initial signal points r(4j) and r(4j+1) [r(4j+2) and r(4j+3)]chosen from a 256-point [512-point] two dimensional square signal set which lies on the grid $Z^2+(0.5, 0.5)$. First, the six tuple [seven-tuple] Z-bits are used to select a signal point from the 64-point [128-point] region-0 signal set 261. This signal set is divided into four subsets which are cosets of $2Z^2$ (indicated by different shadings in FIGS. 13A and 13B). The signal points are labeled such that Z1 and Z0together select one of the cosets according to the labeling shown in the lower left corner of FIG. 13A. The labeling of the remaining bits Z5,Z4,Z3,Z2 is shown only for coset a. For other cosets, the labeling can be obtained by the rule that 90 degree rotation of a point around the center (4,4) [8,0] of the region-0 signal points result in the same labeling.

The Wei encoder 152 (FIG. 15) insures that the minimum distance between allowable sequences of region 0 points is kept large.

The S-bits S1,S0 determine the final region of the initial point according to the rule:

| S1S0 | Region |
|------|--------|
| 00   | 0      |
| 01   | 1      |
| 10   | 2      |
| 11   | 3      |

Figure 14B:
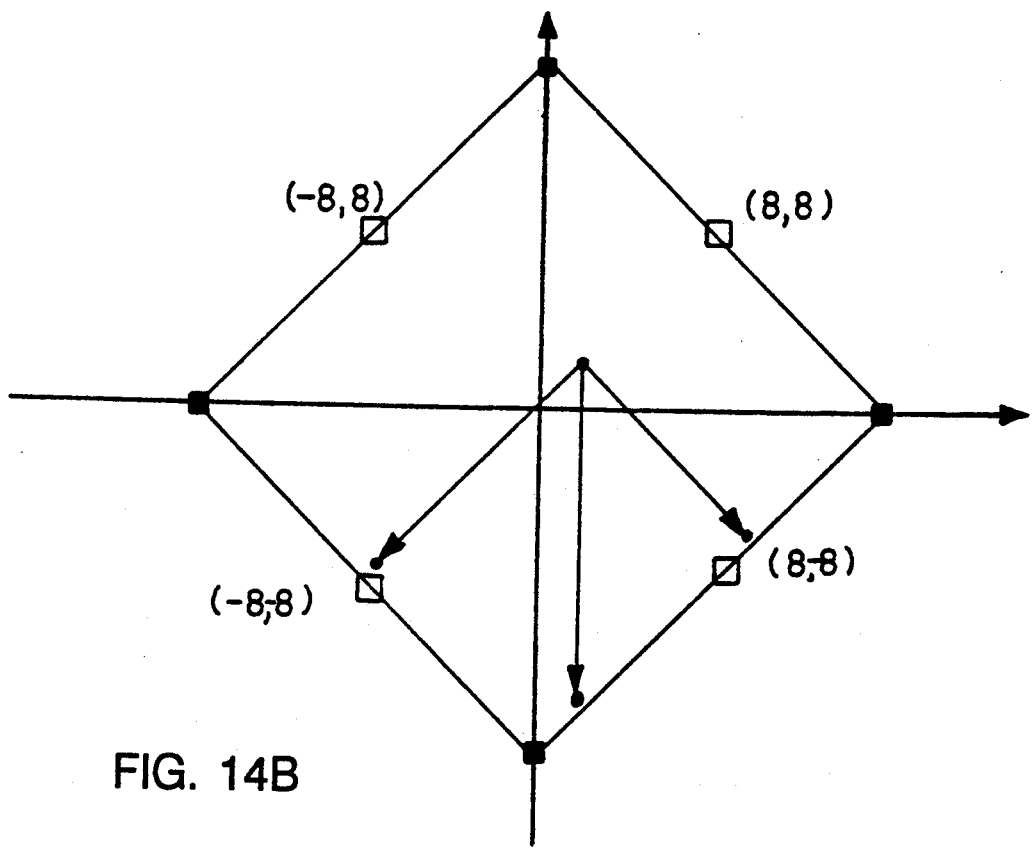
FIGS. 14A, 14B are diagrams of quadrant shifting.
Figure 14A:
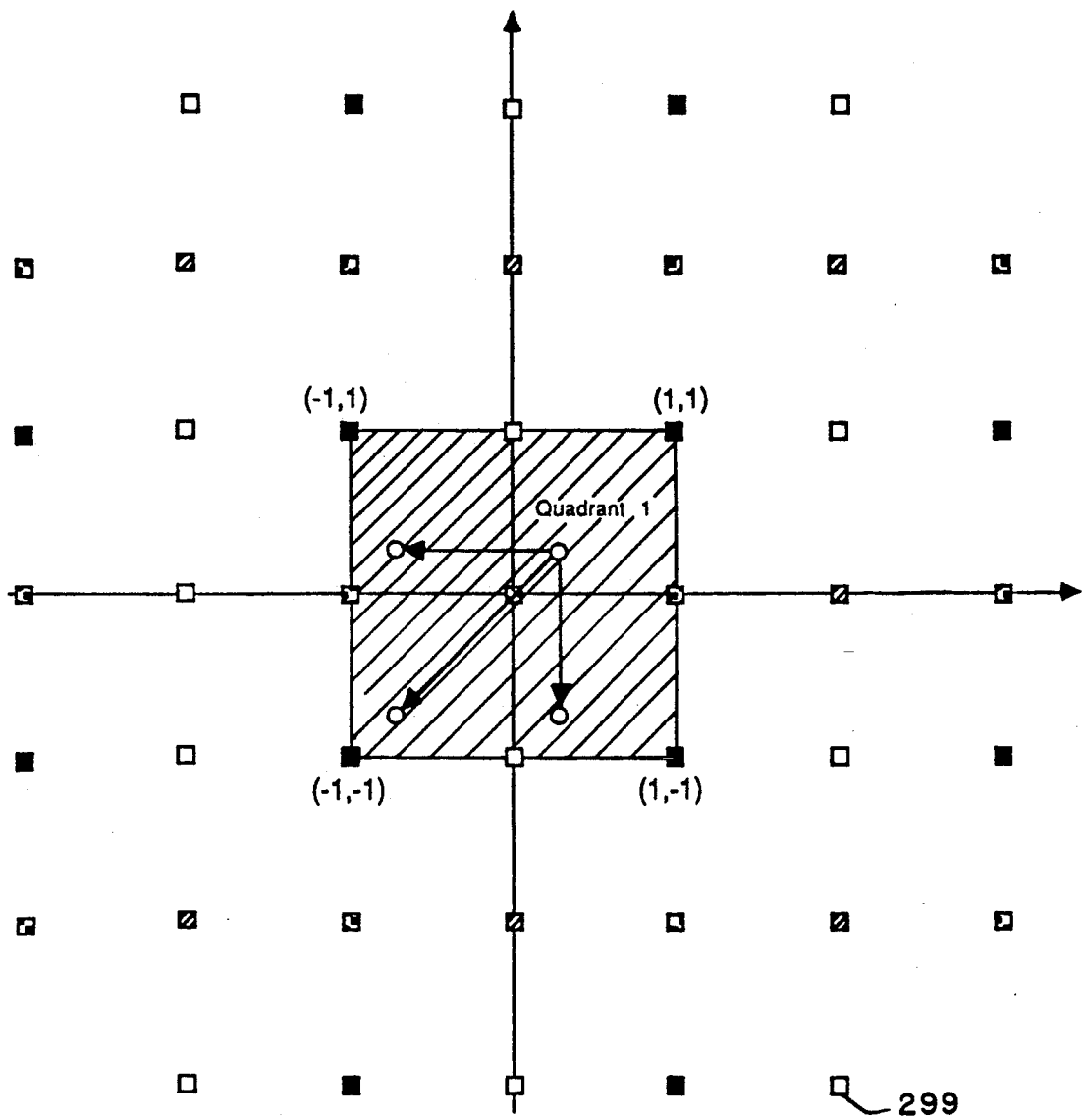

Referring to FIGS. 14A, 14B, the signal points in region-0 are moved to the region chosen by the S-bits in such a way that they remain in the same coset of $8Z^2$ [$8RZ^2$]. This is done by offsetting the region-0 point by (0,0), (0,−8), (−8, −8), or (−8,0) [(0,0), (−8,−8), (−16,0), or (+8,−8)]. It follows that the translated final point is in the same coset of $Z^2$ as the region-0 point. Therefore, the minimum distance between allowable sequences remains unchanged. The signal points obtained in this manner form the initial sequence x(D). Thus the S-bits can be viewed as a coset representative sequence which determines the coset of $16Z^2$ in $8Z^2$ [$16RZ^2$ in $8RZ^2$] for the elements of initial sequence x(D).

Figure 15:
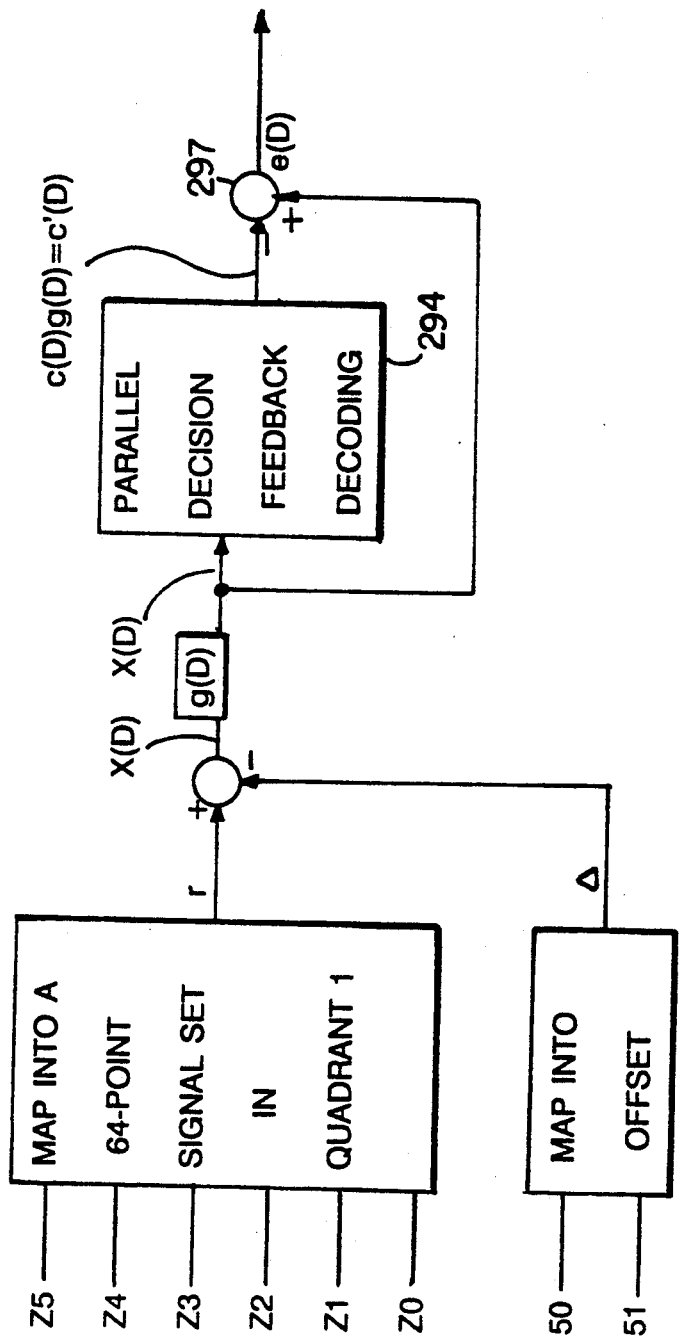
FIG. 15 is a diagram of portions of the trellis precoder of FIG. 9.

Referring to FIG. 15, the initial sequence x(D) is transformed into the transmitted sequence e(D) using parallel decision feedback decoding (PDFD) 294 (which, along with the circuitry of FIG. 3, is part of the trellis precoder 124 of FIG. 9). It is possible to replace PDFD by a more powerful RSSE decoder, or by some other reduced complexity decoder for the filtered trellis code $C_s'$.

As we saw earlier, the optimum decoder selects from the shaping code $C_s$ the code sequence $c_s(D)$ which minimizes the mean-squared error between the sequences $x'(D)=x(D)g(D)$ and $c_s'(D)=c_s(D)g(D)$. The transmitted sequence is the error sequence $e(D)=x'(D)-c_s'(D)$. The code sequence selected by PDFD will not generally result in minimum MSE, however, experiments indicate that the excess MSE will often be small. For example, for a channel with two coefficents, PDFD can achieve 0.5–0.85 dB shaping gain, depending on the values of $h_1$ and $h_2$.

Now, we consider the operation of PDFD in some detail. First, we describe the shaping code $C_s$.

Referring again to FIGS. 14A and 14B, the two-dimensional symbols of this code are chosen from the integer lattice $8Z^2$ [$8RZ^2$]299. These symbols are partitioned into four subsets which correspond to the (four) cosets of $16Z^2$ in $8Z^2$ [$16RZ^2$ and $8RZ^2$] and are labeled as A, B, C and D as shown in the lower-left corner of FIG. 14A.

All possible sequences $c_s(D)$ in the shaping code $C_s$ are represented by the trellis diagram of FIG. 4. Here, from any state there are two branches 302, each branch representing a two dimensional subset. For example, state 0 has two branches labeled A and B.

PDFD operates recursively using the Viterbi algorithm and in synchronism with the four-dimensional Wei encoder such that ever other baud it releases two delayed error symbols e(4j−M) and e(4j+1−M) [e(4j+2−M) and e(4j+3−M)], where M (an even number) is the decoding delay measured in number of bauds. Every baud interval, the VA has in storage four path metrics $\lambda_i(4j+l)[\lambda_i(4j+l+2)]$, i=0,1,2,3, and l=0,1, one for each state in the trellis diagram. The VA also has in storage a finite history of previously hypothesized error symbols $e_i(4j+1-m)$ [$e_i(4j+2+1-m)$], i=0,1,2,3, l=0,1 and m=1,2,...,M, one for each state. In each iteration (every baud), the paths are extended by incrementing path metrics by the branch metrics; the branch metric for the path branch p(p=1,2) from the i 'th state is described by $$b_{i,p}(4j+l) = |e_i(4j+l-1) h_1 - e_i(4j+l-2) h_2 + x(4j+l) - c_{i,p}(4j+l)|^2$$

$$[b_{i,p}(4j+l+2) = |-e_i(4j+l+1) h_1 - e_i(4j+l)h_2 + x(4j+l+2) - c_{i,p}(4j+l+2)|^2]$$

where $c_{i,p}(4j+l)$ [$c_{i,p}(4j+l+2)$] is a symbol from the coset of $16Z^2$ [$16RZ^2$] associated with this branch that gives the minimum value for the branch metric. For each state i' after the transition, the accumulated metric of the two merging paths are compared and the path with the smaller metric is declared a survivor; its path metric becomes the new path metric for state i and the error symbol for the surviving transition (i*,p*), which is given by $$e_{i'}(4j+l) = -e_{p*}(4j+l-1)h_1 - e_{p*}(4j+l-2) h_2 + x(4j+l) - c_{i*,p*}(4j+l),$$
$$[e_{i'}(4j+l+2) = -e_{p*}(4j+l1)h_1 - e_{p*}(4j+l) h_2 + x(4j+l+2) - c_{i*,p*}(4j+l+2)]$$

becomes its most recent error symbol stored in its path history for subsequent use. Every other baud, or when l=1, the algorithm determines the state with the minimum path metric, traces back its error symbol history for M symbols, and releases the error symbols for times 4j−M and 4j−M+1[4j−M+2 and 4j−M+3] as outputs.

Note that the error symbols generated by the precoder 124 lie inside the Voronoi region of the sublattice $16Z^2$, [$16RZ^2$] which is a square of side 16 [a rotated square of side $16\sqrt{2}$], centered at the origin, independent of the channel response h(D). When $h_1$ and $h_2$ are both non-integers and h(D) is FIR, then the error symbols can take infinitely many values within that square.

In trellis precoding using trellis codes that are based on partitions of binary lattices, the elements $e_j$ of the transmitted sequence belong to a 2D constellation that lies within a square boundary. Furthermore, trellis precoding expands the size of the 2D constellation. Moreover, all these effects, and in addition, the further imbalance in the sizes of the Voronoi regions of the time zero lattices $\Lambda_{s0,k}$, increase the peak-to average ratio of the transmitted symbols, which may be undesirable. It is possible to reduce the PAR and obtain a more circular boundary by applying constraints to PDFD (FIG. 7). For example, PDFD can be constrained in such a way that it only selects code sequences $c_s'(D)$ (from the filtered code $\underline{C}_s'$) which result in transmitted sequences e(D) whose elements $e_j$ have magnitudes no greater than some predetermined radius $R_c$; i.e., $|e_j| \leq R_c$. When $R_c$ is not too small, the decoder can proceed without violating the constraint.

This type of constraint can be incorporated into any RSSE type decoder very easily by deemphasizing those branches of the trellis whose mean squared error (MSE) metrics exceed $R_c^2$, by multiplying them with an appropriately chosen number Q. The larger Q gets, the harder the constraint becomes. This reduces the probability of choosing points lying outside the constraint circle. When Q is sufficiently large, and $R_c$ is not very small, points outside the constraint circle will never be selected. Note that if $R_c$ is too small, circle one should not disallow branches, because this may force the decoder to choose an illegal sequence as a code sequence, and then the initial sequence x(D) cannot be correctly recovered in the receiver.

When the transmitted sequence e(D) is filtered before transmission over the channel, it may be beneficial to apply the constraint in higher dimensions (on groups of successive elements of the sequence e(D)), in order to minimize the PAR after the filtering. For example, the constraint may be applied in four dimensions by comparing the sum of the two most recent branch metrics against some squared radius $R_c^2$. The decoder could force the condition $|e_{2j}|^2 + |e_{2j+1}|^2 < R_c'$, $R_c'$ being the radius of a 4D square. This constraint may be applied blockwise or sequentially in a sliding window fashion.

The VA is further slightly modified to insure that the code sequence $c_s'(D)$ it selects is an allowable sequence from $\underline{C}_s'$, since otherwise the initial sequence x(D) cannot be correctly recovered. Whenever the VA traces back the path history to make a decision, it traces back other paths as well to determine whether they end in the same state; when they don't, those paths are pruned by setting their current path metric to a very large value. This insures that only allowable code sequences are selected.

The precoded sequence e(D) is passed through the transmitter shaping filter 106 (FIG. 10), D/A converted, filtered by the analog front end 107 and subsequently transmitted over the channel.

At the receiver, the received signal r(t) is first filtered by the analog filter 109 (FIG. 10) to remove out-of-band noise, and A/D converted into a digital stream $(z_n)$ at a rate of M/T. This digital stream is input into the adaptive linear equalizer 108 with $N_1 + N_2 + 1$ taps and a tap-spacing of T/M (not to be confused with the case of M for delay elsewhere). The output of this filter is sampled at the baud rate 1/T, then demodulated and subsequently filtered by the prediction filter h(D) 110 to approximately produce the received sequence $$r(D) = e(D)h(D) + n'(D) = x(D) - c_s(D) + n'(D) = y(D) + n'(D)$$

As we discussed earlier the elements of y(D) lie in the same coset of $2Z^4$ in $Z^2$ as x(D), and thus the same coset of $2Z^2$ in $Z^2$. Therefore, the minimum distance between possible sequences y(D) is no smaller than the minimum distance between possible input sequences x(D) and the sequence y(D) can be decoded with a Viterbi decoder 133 for x(D), except the decoder must be slightly modified to take into account the potentially different signal set boundaries for the elements $y_j$ of y(D).

It can be shown that the shape and size of the signal set boundary for $y_j$'s depend on the channel coefficients $h_1$ and $h_2$. For example, if $h_1$ and $h_2$ are both real, then the boundary will be a square of side length $2(1 + h_1 + h_2)$, again centered at the origin. If the output constellation size is of concern, it may be beneficial to limit the magnitudes of the coefficients during training. This may be accomplished using a constrained adaptation algorithm.

It is possible to make the decoder 133 transparent to the constellation expansion that is caused by the channel filter. If we take the received sequence y(D) and translate it by some sequence a(D), where the elements of a(D) are elements of the lattice $16Z^2$ [$16RZ^2$], then the modified sequence $y(D) - a(D) = x(D) - c_s(D) - a(D)$ is still equal to x(D) mod $\underline{C}_s$, since the component $c_s(D) + a(D)$ is an allowable code sequence. It follows that the received sequence can be translated inside the Voronoi region of $16Z^2$ [$16RZ^2$]. The Viterbi algorithm for the (coding) code $\underline{C}_c$ can now operate on this translated sequence assuming a square boundary of side 16 during the first two bauds of a frame and a rotated square of boundary of side $16\sqrt{2}$ during the next two bauds of the frame and output a delayed estimated sequence y''(D).

Every other baud, the VA will produce two delayed decisions y''(4j) and y''(4j+1) [y''(4j+2) and y''(4j+3)]. To extract the I-bits from these, we first obtain the Z bits by translating the decisions into region 0, in such a way that the 2D elements remain in the same coset of $8Z^2$ [$8RZ^2$]. Then, the Z bits can be extracted using an inverse mapping according to FIGS. 15A and 15B.

To extract the S-bits, we first label the regions (as before) according to

| Region | SQ1SQ2 |
|---|---|
| 0 | 00 |
| 1 | 01 |
| 3 | 11 |
| 2 | 10 |

Then, the regions of y''(4j) and y''(4j+1) determine the labels SQ1(4j)SQ0(4j) [SQ1(4j+2)SQ0(4j+2)]and SQ1(4j+1)SQ0(4j+1)[SQ1(4j+3)SQ0(4j+3)]. It is easy to show that SQ1(i)SQ0(i)=S1(i)S0(i)$\oplus_2$B1(i)B0(i), where i=4j or 4j+1[4j+2or 4j+3], $\oplus_2$ represents exclusive-or operation and B1(i)B0(i) is a binary two-tuple represeting the coset (A=00, B=11, C=01 and D=10) of $16Z^2$ [$16RZ^2$] for the code symbol $c_s(i)$ chosen during precoding by PDFD.

Figure 16:
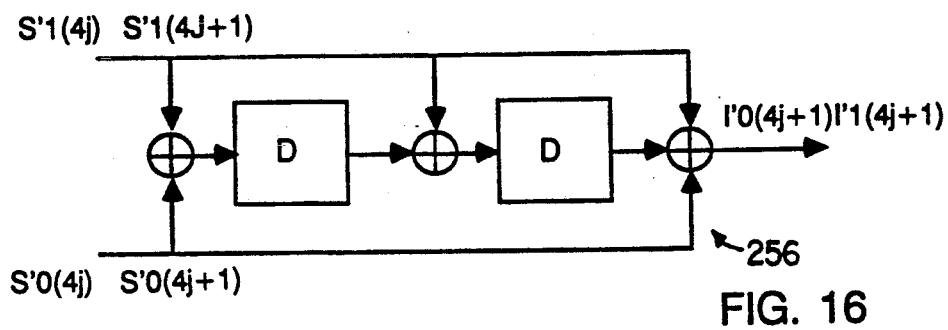
FIG. 16 is a block diagram of a binary syndrome former.
Figure 17:
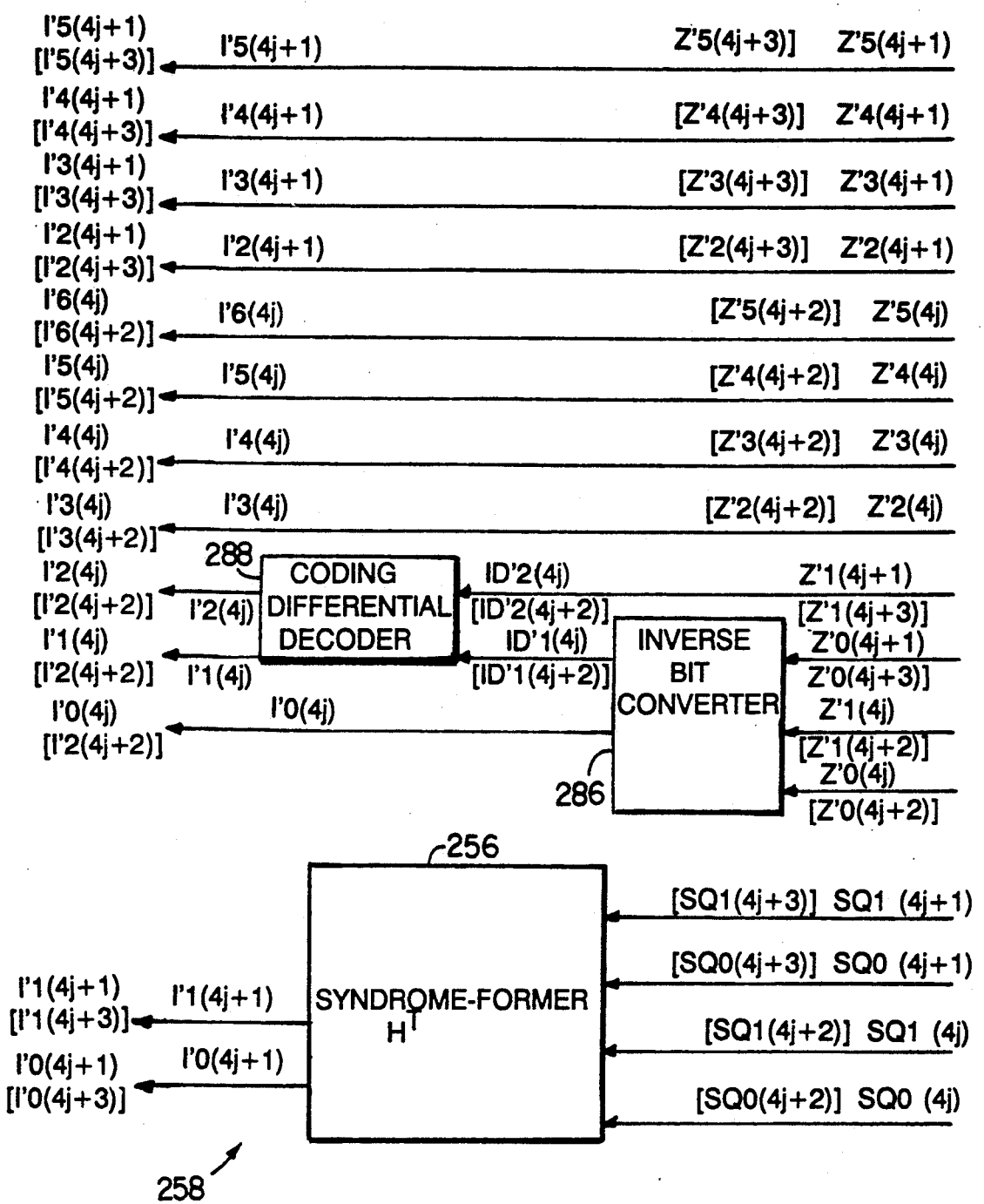
FIG. 17 is a block diagram of the binary portion of the trellis decoder.

Referring to Figs. 16 and 17, the labels SQ1(i)SQ0(i) are then sequentially passed through a feedback-free syndrome former $H^T 256$. The syndrome-former has the property that any allowable sequence of coset labels B1(i)B0(i) will produce an all-zero sequence at its output. Furthermore, $(H^{-1})^T H^T = I$, the identity matrix. Therefore, a sequence which first passes through $(H^{-1})^T$ and then through $H^T$ will remain unchanged. Thus, as shown in FIG. 17, at the output of the syndrome-former we obtain the transmitted bits I1'(4j+1)I0'(4j+1) [I1(4j+3) I0'(4j+3)], as long as the estimates y"(i) are correct. When there are occasional errors, they do not create catastrophic error propagation, because $H^T$ is feedback free.

Referring again to FIG. 17, the remaining information bits can be recovered by an inverse bit converter 286 and a coding differential decoder 288 which operates according to the relation:

$$I2'(4j)I1'(b\ 4j) = ID2'(4j)ID1'(4j)\theta_4 ID2'(4j-2)ID1'(b\ 4j-2)$$

$$[I2'(4j+2)I1'(4j+2) = ID2'(4j+2)ID1'(b\ 4j+2)\theta_4 ID2'(4j)ID1'(4j)]$$

where $\theta_4$ is a modulo-4 subtraction. Referring again to FIG. 11 the I bits are then descrambled in a descrambler which forms part of unit 133 and delivered to the DTE via a buffer 135.

DIFFERENTIAL CODING FOR SHAPING

Suppose the channel introduces a phase rotation of 90k degrees, k=1, 2, or 3. The translation of the error point into regiont-1 is then rotated around the point (4,4,) [8,0] by the same amount. Since the Wei code is transparent to 90k degree phase rotations, the mapping used in the transmitter guarantees that the Z bits can be correctly recovered. Unfortunately, this is not true for the region labels SQ1SQ0.

Figure 18:
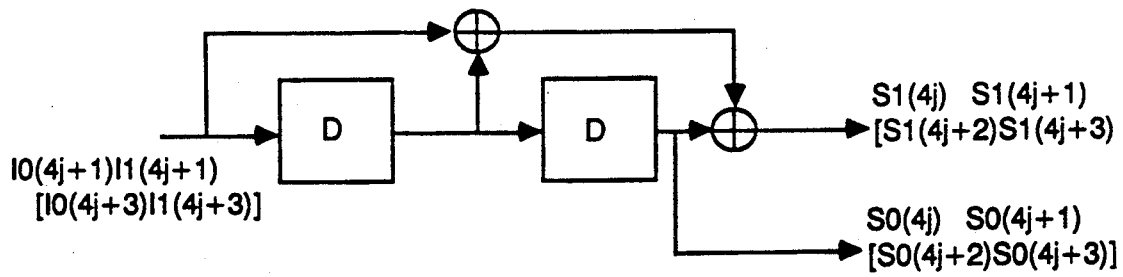
FIG. 18 is a block diagram of a binary inverse syndrome former.
Figure 19:
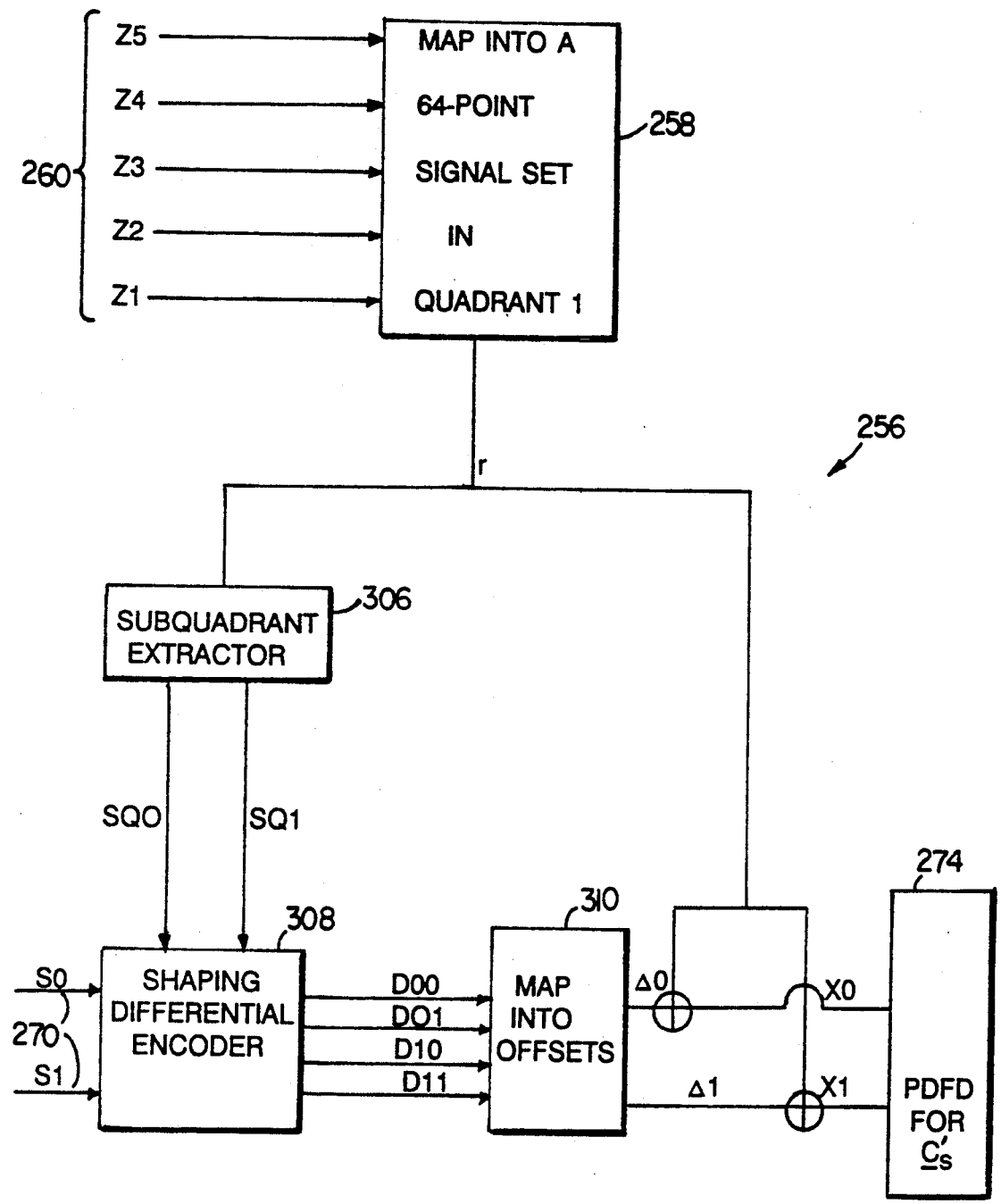
FIG. 19 is a block diagram of a constellation former.
Figures 20, 21:
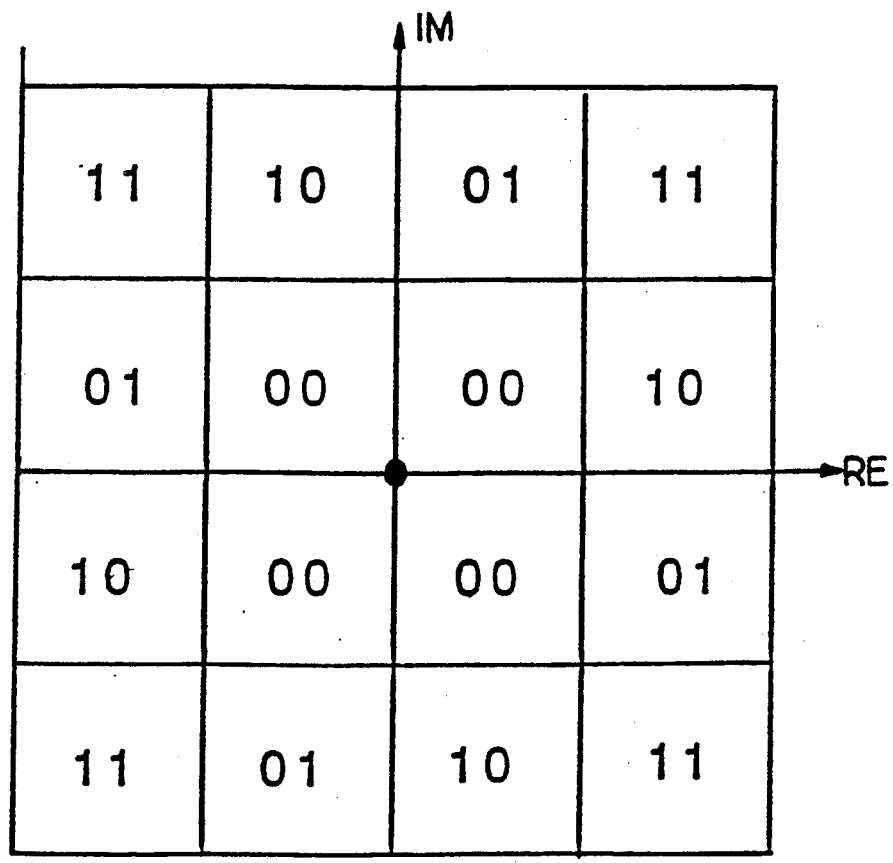
FIG. 20 is a diagram of a quadrant labeling scheme.
FIG. 21 is a diagram of a phase-invariant labeling scheme.

To remedy this situation, the label sequence SQ1SQ0 can be generated according to the phase-invariant labeling shown in FIG. 18. In order to guarantee that the relationship $SQ1SQ0 = S1S0 \oplus_2 B1B0$ still holds, a differential encoding operation is necessary. This is done as follows: Referring to FIG. 19, for each signal point obtained through region-0 mapping 258, we extract its subregion label SQ1SQ0 with a subregion extractor 306 according to FIG. 20. A shaping differential encoding 308 and a map into offsets 310 use the bits SQ1SQ0 and S1S0 to offset the region —0 point into two new points x0(i) and x1(i), where i=4j [4j+2] or i=4j+1 [4j+3] such that they remain in the same coset of $Z^2$. This mapping can be described by the following two tables:

| SQ0 | SQ1 | S0 | S1 | D00 | D01 | D10 | D11 |
|---|---|---|---|---|---|---|---|
| 0 | 0 | 0 | 0 | 0 | 0 | 1 | 1 |
| 0 | 0 | 0 | 1 | 1 | 0 | 0 | 1 |
| 0 | 0 | 1 | 0 | 0 | 1 | 1 | 0 |
| 0 | 0 | 1 | 1 | 1 | 1 | 0 | 0 |
| 0 | 1 | 0 | 0 | 0 | 1 | 0 | 1 |
| 0 | 1 | 0 | 1 | 0 | 0 | 0 | 0 |
| 0 | 1 | 1 | 0 | 1 | 1 | 1 | 1 |
| 0 | 1 | 1 | 1 | 1 | 0 | 1 | 0 |
| 1 | 0 | 0 | 0 | 1 | 0 | 1 | 0 |
| 1 | 0 | 0 | 1 | 1 | 1 | 1 | 1 |
| 1 | 0 | 1 | 0 | 0 | 0 | 0 | 0 |
| 1 | 0 | 1 | 1 | 0 | 1 | 0 | 1 |
| 1 | 1 | 0 | 0 | 1 | 1 | 0 | 0 |
| 1 | 1 | 0 | 1 | 0 | 1 | 1 | 0 |
| 1 | 1 | 1 | 0 | 1 | 0 | 0 | 1 |
| 1 | 1 | 1 | 1 | 0 | 0 | 1 | 1 |

-continued

| Di0 | Di1 | Δ i (offset) | |
|---|---|---|---|
| 0 | 0 | 0.0+j0.0 | [0.0−j0.0] |
| 0 | 1 | 0.0−j8.0 | [−8.0−j8.0] |
| 1 | 0 | −8.0+j0.0 | [8.0−j8.0] |
| 1 | 1 | −8.0−j8.0 | [−16.0−j8.0] |

In the PDFD decoder, the point x0(i) is used for branches corresponding to cosets A and B, whereas xl(i) is used for branches corresponding to cosets C and D. It can be shown that if SQ1SQ0 is the subregion label of the received point, then $SQ1SQ0 = S1S0 \oplus_2 B1B0$. Therefore, by passing the subregion label (which is rotationally invariant) through the syndrome-former $H^T$ we can recover the bits I0(4j+1) and I1(4j+1) [I0(4j+3) and I1(4j+3)]even in the presence of 90k degrees phase offset.

HEXAGONAL 2D CONSTELLATIONS

If we choose the underlying shaping trellis code $C(\Lambda/\Lambda';C)$ as a code based on a partition $\Lambda/\Lambda'$ of so-called ternary or quaternary lattices whose constituent 2D lattice and sublattice $\Lambda_2$ and $\Lambda_2'$ are versions of the hexagonal 2D lattice $\Lambda_2$, then the elements $e_j$ of the transmitted sequence will be bounded within a region $R_y(\Lambda_2')$ which is hexagonal rather than square. Such a constellation has the advantage of being more nearly spherical.

ALTERNATIVE FORMULATION BASED ON LABEL TRANSLATES

In the preferred embodiment of trellis precoding, we have used a linear (mod-2) code $C_s$. This allowed us to use the syndrome-former mapping methods for preventing error propagation. It is possible to give an alternative formulation of trellis precoding, based on label translates of trellis codes, such that the syndrome-former methods can be applied with nonlinear trellis codes, as well.

As before, for coding we use an N dimensional trellis code $C_c(\Lambda_c/\Lambda_c';C_c)$, where $\Lambda_c/\Lambda_c'$ is a binary lattice partition of order $2^{n_c}$ and $C_c$ is a binary, rate-$k_c/n_c$ convolutional code ($n_c = k_c + r_c$). For shaping and precoding, we use a trellis code $C_s(\Lambda_s/\Lambda_s';\ C_s)$ based on a binary rate $k_s/n_s$ convolutional code $C_s(n_s = k_s + r_s)$.

Figure 22:
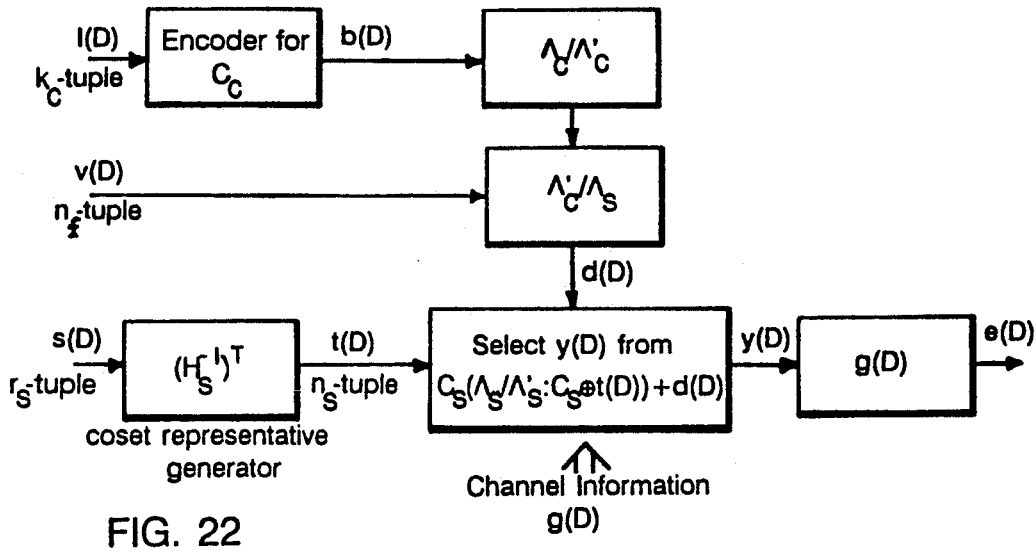
FIG. 22 is a diagram of an encoder for trellis precoding based on label-translates of trellis codes.

As shown in FIG. 22, a sequence of $r_s$-tuples s(D) enters an inverse syndrome former $(H^{-1})^T$ for the convolutional code $C_s$ to produce a sequence of $n_s$-tuples t(D), which specifies a label-translated code $C_s(\Lambda_s/\Lambda_s';\ C_s \oplus_2 t(D))$. The trellis precoder will select the channel output sequence y(D) from a coset $C_s(\Lambda_s/\Lambda_s';\ C_s \oplus_2 t(D)) + d(D)$ of this label-translated code, where d(D) is a coset representative sequence identifying cosets of $\Lambda_s$ in some translate $\Lambda_c + a$ of $\Lambda_c$.

A sequence of $k_c$-tuples i(D) enters the convolutional encoder Cc to produce a sequence of $n_c$-tuples b(D). The sequence b(D) together with an uncoded sequence of $n_f$-tuples v(D)specifies the coset representative sequence d(D). Then a channel output sequence y(D) that lies in $C_s(\Lambda_s/\Lambda_s';\ C_s + t(D)) + d(D)$ can be identified by d(D) which specifies a sequence of cosets of $\Lambda_s$ in $\Lambda_c + a$, a sequence $z(D) = c_s(D) + t(D)$ with $c_s(D) \epsilon C_s$, which further specifies a sequence of cosets of $\Lambda_s'$ in $\Lambda_s + d(D)$ and a sequence $\lambda(D) \epsilon \Lambda_s'$ which selects a particular sequence in that coset. A decoder will find the sequences $c_s(D)$ and $\lambda(D)$, such that the resulting y(D), after filtering by the channel inverse g(D), has as small an average power as possible. The transmitted sequence e(D) is the filtered sequence: e(D)=y(D)g(D).

Figure 23:
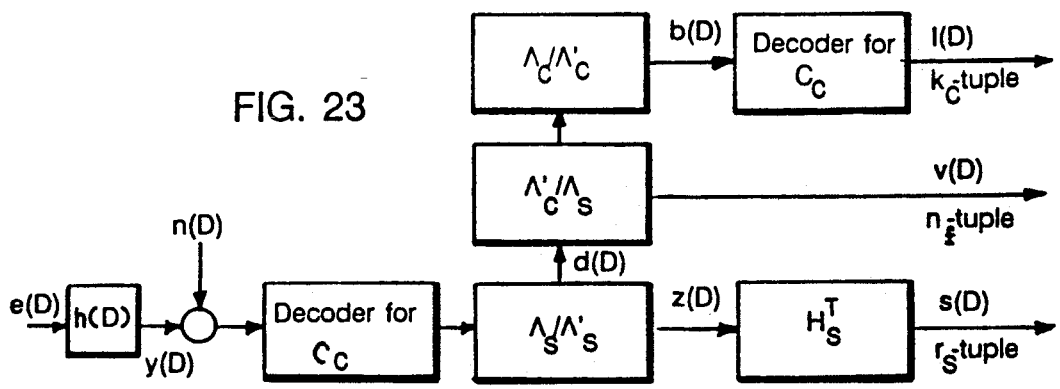
FIG. 23 is a diagram of a decoder for trellis precoding based on label-translates.

In the receiver, after appropriate front end filtering, we obtain the observations r(D)=e(D)h(D)+n(D)=y(D)+n(D). Referring to FIG. 23, the sequences i(D), v(D) and s(D) can be recovered as follows. First, since $\Lambda_s$ is a sublattice of $\Lambda_c'$, the sequence $\underline{y}$(D) is a legitimate code sequence from $\underline{C}_c$. Therefore, a conventional decoder for $\underline{C}_c$ can be used to find an estimate y(D), as before, with the same decoding complexity and probability of error as that of the code $\underline{C}_c$ on an ideal channel, h(D)=1. As before, it is possible to translate r(D) to a fundamental region of $\Lambda_s'$, thus making the decoder essentially independent of the channel response h(D) without affecting the performance. In the absence of decoding errors, the sequence d(D), representing the cosets of $\Lambda_s'$ in $\Lambda_c$+a, can be obtained directly from y(D). This can be used to recover the sequences b(D) and v(D). The information sequence i(D) can be found using a decoder for the convolutional code $C_c$. The sequence $z(D)=c_s(D)\oplus t(D)$ representing the coset of $\Lambda_s'$ in $\Lambda_s$ and be recovered also directly from y(D). The estimate of the sequence s(D) is obtained by passing z(D) through a syndrome former $H^T$; i.e., $s(D)=z(D)H^T=c_s(D)H^T \oplus t(D)H^T=s(D)(H^{-1})^T H^T = s(D)$, where we used the well-known fact that $c_s(D)H^T=0$. If $H^T$ is chosen to be feedback free, then s(D) can be recovered without catastrophic error propagation.

The selection of the sequence e(D) can be done, as before, using RSSE techniques, with the slight modification that trellis branches will now correspond to cosets of $\Lambda_s'$ in $\Lambda_s+d_k$ as identified by the label-translates $z(D)=c_s(D)\oplus t(D)$, the coset representative sequence d(D) and the sequence $\lambda$(D), and the branch metrics are computed according to $$|e_j|^2 = |y(z_k = t_k + c_{s,k}, d_k, \lambda_k) - \Sigma_{j \geq 1} e_{k-j} h_j|^2.$$

Here we have used the notation $y(z_k, =t_k \oplus c_{s,k}, d_k, \lambda_k)$ to indicate a channel output symbol $Y_k$ specified by $z_k$, $d_k$ and $\lambda_k$.

With this method, we can send $\beta N/2 = k_c + n_f + r_s$ bits per N dimensions, where $n_f= \log_2|\Lambda_c'/\Lambda_s|$. As before, we can increment $n_f$ by N/2 (or equivalently, by 1 bit per two dimensions) by replacing $\Lambda_s$ by R$\Lambda_s$, because $\log_2|\Lambda_c/R\Lambda_s| = \log_2|\Lambda_c'/\Lambda_s| + N/2$. (Or similarly, we can increment $n_f$ by N/2 by replacing $\Lambda_c$ by R$\Lambda_c$). To send $(N/2)\beta = k_c + r_s j + (d/2^m)(N/2)$ bits/N dimensions, where $0 \leq d \leq 2^m$, we can again define a frame of length $(N/2)2^m$ bauds, and use the code $\underline{C}_s$ for $(N/2)(2^m-d)$ bauds, and its scaled versions R$\underline{C}_s$ for (N/2)d bauds. (A similar effect can be achieved by replacing the coding code $\underline{C}_c$ by its time-varying versions based on the codes $\underline{C}_c$ ad R$\underline{C}_c$). The implementation given above for the time invariant case remains essentially unchanged, except one now has to take into account the variations in scaling. Again, constellatation constraints can be applied to control PAR.

B. ALTERNATIVE FORMULATION BASED ON REGIONS

It is possible to formulate trellis precoding using convolutional codes and N dimensional regions, instead of trellis codes. This formulation is more general in some respects. In this section, we describe this formulation, first using time invariant regions, and then with regions having time-varying scaling to support fractional rates.

As before, for coding we use an N dimensional trellis code $\underline{C}_c(\Lambda_c/\Lambda_c'; \underline{C}_c)$, where $\Lambda_c/\Lambda_c'$ is a binary lattice partition of order $2^{n_c}$ and $C_c$ is a binary, rate-$k_c/n_c$ convolutional code. For shaping and precoding, instead of a trellis code, we use a binary, rate $k_s/n_s$ convolutional code $C_s$ and a set of N-dimensional regions R(j), j=1, . . .,J, where J may be infinite. Each region is partitioned into $2^{n_s}$ subregions $\underline{R}_n$(j), j=1, . . . ,J in such a way that every subregion contains an equal number of points from each of the $2^{n_c}$ cosets of $\Lambda_c'$ in a translate $\Lambda_c$ +a of $\Lambda_c$. To transmit at a rate $\beta$, where $\beta \geq (2/N)(k_c + r_s)$, the regions must be properly scaled such that each subregion contains $2^{n_c + n_f}$ points from $\Lambda_c$+a, where $n_f = \beta N/2 - k_c - r_s$.

Figure 24:
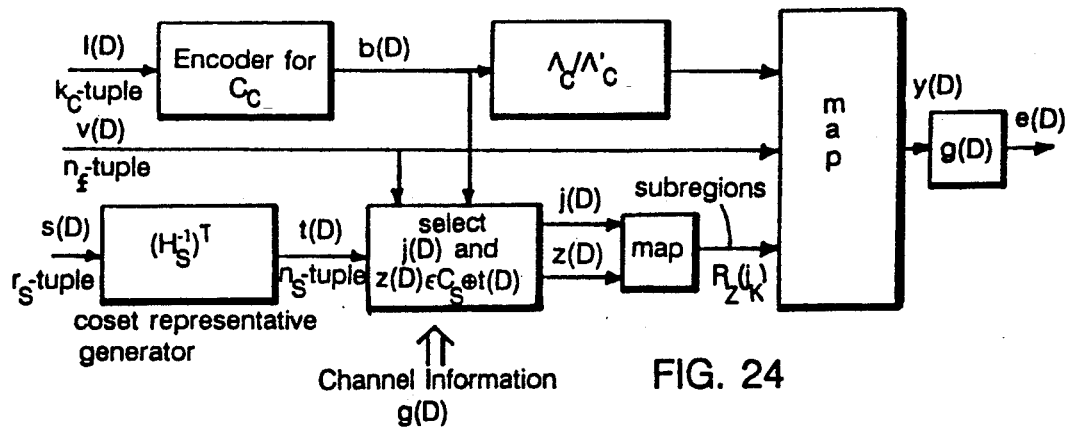
FIG. 24 is a diagram of an encoder for trellis precoding based on regions.

We select the elements of the channel output sequences y(D) from cosets of $\Lambda_c'$ in $\Lambda_c$+a, as specified by the sequence of $n_c$-tuples b(D) produced by the convolutional encoder $C_c$, from within one of the subregions $\underline{R}_n$(j). Any signal point $y_k$ from $\Lambda_c$+a, in any one of the regions $\underline{R}$(j), can be identified by a quadruplet: y($b_k$, $v_k$, $z_k$, $j_k$), where an index $j_k$ selects a region $\underline{R}$(j), an $n_s$-tuple $z_k$ selects a subregion $\underline{R}_n$(j), an $n_c$-tuple $\overline{b}_k$ specifies one of $2^{n_c}$ cosets of $\Lambda_c'$ in $\Lambda_c$+a, and an $n_f$ tuple $v_k$ picks one of $2^{n_f}$ points of that coset in $\underline{R}_n$(j). As illustrated in FIG. 24, the convolutional encoder produces the sequence of $n_c$-tuples b(D), and uncoded symbols form the sequence of $n_f$-tuples v(D). The sequences j(D) and z(D) which identify the subregions are selected as follows. First, a sequence of $r_s$- tuples, s(D), is mapped into a sequence of $n_s$- tuples t(D) according to $t(D) = s(D)(H^{-1})^T$, where $(H^{-1})^T$ is a right inverse to the n×r syndrome-former matrix for $C_s$. Then, in the key step of trellis precoding, a decoder selects j(D) and $z(D) \epsilon t(D) \oplus 2C_s$ such that the transmitted sequence e(D)=y(D)g(D) has as small an average power as possible.

Figure 25:
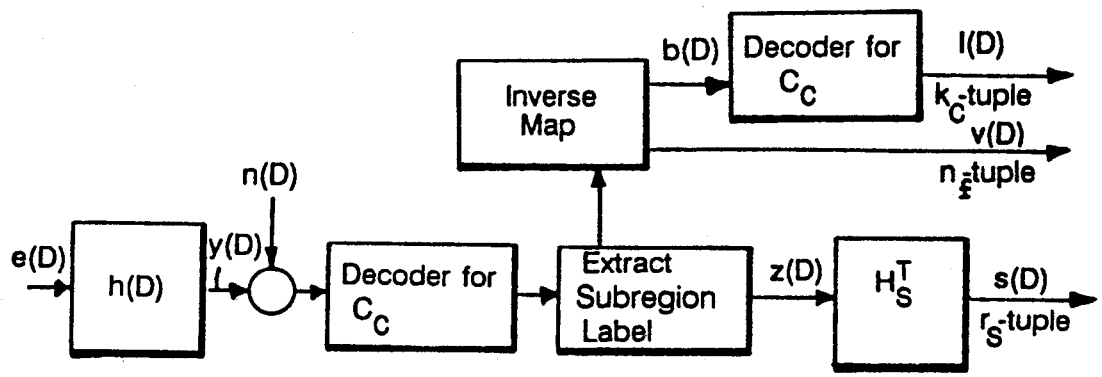
FIG. 25 is a diagram of a decoder for trellis precoding based on regions.

Since y(D) is a code sequence from $\underline{C}_c(\Lambda_c/\Lambda_c'; \underline{C}_c)$, it can be decoded, as before, by a decoder for $\underline{C}_c$. Again the decoding complexity and the probability of error will be the same as if the code $\underline{C}_c$ was used on an ideal channel. Referring to FIG. 25, if y(D) is the estimated channel output sequence, then z(D) can be extracted by identifying the subregions $\underline{R}_z$(j) in which the elements $y_k$ lie. The estimates b(D), $\overline{v}$(D) can be found directly from y(D) with an inverse map. The sequence s(D) can be extracted directly from z(D) with a syndrome-former $H^T$ according to $(s(D) = z(D)H^T$, because $c_s(D)H^T = 0$ and $(H^{-1})^T H^T = I$, where I is the r×r identity matrix. If $H^T$ is chosen to be feedback free, then s(D) can be recovered with no error propagation.

Having discussed the operational principles, we now turn to the selection of the index sequences j(D) and z(D). To minimize the output average power, we need to search a trellis with states $s_k' = [s_k; j^{k-1}, z^{k-1}]$, where $j^{k-1} = (j_{k-1}, \ldots j_{k-K})$ and $z^{k-1} = (z_{k-1}, \ldots z_{k-K})$. If J and K are both finite, then this trellis will have a finite number of states. But even in that case, it is often necessary to reduce complexity to make the search feasible. Again, this can be accomplished by an RSSE like shaping decoder. An RSSE trellis can be constructed by applying set partitioning principles to the past values of $j_{k-i}$ and $z_{k-i}$, i=1, . . . L$\leq$K. Then, the VA can be applied to search the reduced-state trellis with the branch metrics $$|e_k|^2 = |y(b_k, v_k, z_k = t_k \oplus 2c_{s,k}, j_k) - \Sigma_{j \leq 1} e_{k-j} h_j|^2$$

where $c_{s,k}$ is an $n_s$-tuple corresponding to the branches of the convolutional code, and the minimization is over all possible values of $j_k$. Here the minimization is over all possible indices $j_k$, $1 \leq j_k \leq J$, for the regions $\underline{R}(j)$. Notice that, for large values of J, this minimization can be very time-consuming, if one has to compute the above metric for all possible values of $j_k$. Now we will show how this problem is avoided, when the regions are chosen as fundamental regions of lattices.

But first we should note that when the channel is ideal (h(D)=1), and the number of regions is one (J=1), then the method described above reduces to trellis shaping on regions. Notice that in that case, the minimization step in the branch metric computations is absent.

Figure 26:
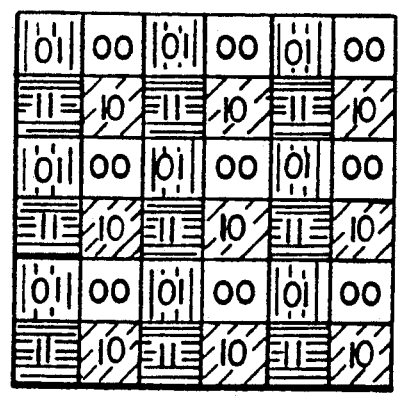
FIG. 26 is a diagram of regions derived from a 4-way partition.

Now let $\Lambda_s/\Lambda_s'$ be an N dimensional lattice partition of order $2^n s$. Next, let $\underline{R}(1)$ be a fundamental region of $\Lambda_s'$, and then form an exhaustive partition of N-space into regions $\underline{R}(j) = \underline{R}(1) + \lambda_j$, were $\lambda_j$ is an element of $\Lambda_s'$, with $\lambda_1 = 0$. Then partition each $\underline{R}(j)$ into $2^n s$ subregions $\underline{R}_n(j)$, such that each subregion is a fundamental region of $\Lambda_s$, and furthermore, each subregion contains an equal number of points from the $2^n c$ cosets of $\Lambda_c'$ in $\Lambda_c + a$. Notice that the regions $\underline{R}(j)$ differ by points on the lattice $\Lambda_s'$, and hence the minimizing step in the branch metric computations is now only as complex as decoding $\Lambda_s'$. An example is shown in FIG. 26 for a 4-way partition of the type $Z^2/2Z^2$.

We may point out that although we have used the syndrome-former methods to generate the coset representative sequence t(D) in the extensions we described above, other mapping methods can be used also. However, in that case, to recover t(D) from z(D) a binary decoder for $C_c$ associated with the set of coset representatives must be used to extract $c_s(D)$ and then form $t(D) = c_s(D) \oplus z(D)$.

Finally, we should also point out that when $C_s$ is a linear code, the original formulation based on fundamental regions of time zero lattices is identical to the formulation based on label translates, and they both can be posed as a special case of the formulation based on regions.

With this method, we can also send $\beta N/2 = k_c + n_f + r_s$ bits per N dimensions. As before, we can increment $n_f$ by N/2 by replacing $\Lambda_c$ by $R\Lambda_c$, to send $(N/2)\beta = k_c + r_s + j + (d/2^m)(N/2)$ bits per N dimensions, where $0 \leq d < 2^m$. We can again define a frame of length $(N/2)2^m$ bauds, and use the code $\underline{C}_c$ for $(N/2)2^m - d_0$ bauds, and its scaled version $R\underline{C}_c$ for $(N/2)d$ bauds. A similar effect can be achieved by varying the scaling of the subregions. The implementation given above for the time-invariant case remains essentially unchaged except one now has to take into account the time-varying nature of the code or the scaling. Again, constraints can be applied to reduce the peak to average ratio.

Other embodiments are also within the following claims. For example, other reduced-complexity decoders (e.g., M algorithm) could be used.

APPENDIX A

TERMINOLOGY AND PRINCIPLES

We first discuss terminology and principles which underlie the invention.

Trellis Precoding

A lattice $\Lambda$ is a collection of N-dimensional vectors c, which form a group under ordinary vector addition A fundamental region $\underline{R}(\Lambda)$ of $\Lambda$ is a region of N-space which contains one and only one point (a coset representative) from each distinct coset (translate) $\Lambda + a$ of $\Lambda$. All fundamental regions of a given lattice have the same volume, $V(\Lambda)$, and their translates $\underline{R}(\Lambda) + c$, $c \in \Lambda$, form a tesselation of N-space. This induces the following coset decomposition: Any N-vector y can be uniquely decomposed as $y = c + e$, where $c \in \Lambda$ and $e \in \underline{R}(\Lambda)$; that means, y is equivalent to a coset representative $e \in \underline{R}(\Lambda)$ modulo $\Lambda$. The translates $\underline{R}(\Lambda) + c$ may be viewed as the decision regions D(c) of a decoder $D(\Lambda)$, whose error regions $D(c) - c$ are all equal to $\underline{R}(\Lambda)$ (to show this correspondence explicitly, in what follows, we will sometimes write $\underline{R}(\Lambda, \underline{D})$ or $\underline{D}(\Lambda, \underline{R})$). Thus, if $e \in \underline{R}(\Lambda)$ is a coset representative, but otherwise an unknown information bearing vector, then it can be recovered from $y = c + e$, without any knowledge about c, by first finding the lattice point c using the decoder $\underline{D}(\Lambda, \underline{R})$ and then forming the error $e = y - c$.

The Voronoi region $\underline{R}_V(\Lambda)$ of a lattice $\Lambda$ is defined as the set of points that are at least as close to the origin as to any other lattice point. The Voronoi region is a fundamental region corresponding to a minimum distance decoder of $\Lambda$ (we ignore the effect of ties at the boundary points).

A rate-k/n convolutional code C is the set of sequences c(D) of q-ary n-tuples, which can be generated by a k×n generator matrix G as its input ranges over all sequences of q-ary k-tuples. In analogy to the fundamental region of a lattice, we can define a set $\underline{R}$ of sequences of q-ary n-tuples, which contains one and only one sequence (a coset representative) from every coset $C \oplus_2 a(D)$ of C, where $\oplus$ represents modulo-q addition. Then, any sequence of q-ary n-tuples z(D) has the unique decomposition $z(D) = t(D) \oplus_2 c(D)$, where $t(D) \in \underline{R}$ and $c(D) \in C$. An unknown coset representative sequence $t(D) \in \underline{R}$ can be recovered from $z(D) = t(D) \oplus_2 c(D)$, by first finding the code sequence c(D) using the decoder $\underline{D}(C, \underline{R})$ for the set of coset representatives $\underline{R}$, and then forming $t(D) = z(D)\beta_2 c(D)$.

If $\Lambda'$ is a sublattice of $\Lambda$, then $\Lambda$ is the union of $|\Lambda/\Lambda'| = V(\Lambda')/V(\Lambda)$ cosets of $\Lambda'$ in $\Lambda$. Then we say $\Lambda/\Lambda'$ is a lattice partition of order $|\Lambda/\Lambda'|$, and each fundamental region $R(\Lambda')$ of $\Lambda'$ will contain $|\Lambda/\Lambda'|$ points from $\Lambda$.

In general, a signal-space trellis code $\underline{C}(\Lambda/\Lambda';C)$ is based on an N-dimensional lattice partition $\Lambda/\Lambda'$ of order $q^n$ and a rate k/n, q-ary convolutional code C. Each coded output n-tuple $b_k$ selects one of the $q^n$ cosets $\Lambda' + \zeta(b_k)$ of $\Lambda'$ in $\Lambda$, or some translate of $\Lambda$, according to some labeling function $\zeta(b_k)$. The trellis code $\underline{C}(\Lambda/\Lambda';C)$ is the set of all sequences c(D) that belong to a sequence of cosets of $\Lambda'$ that could be selected by the code sequences in C. To simplify exposition, we shall often consider two-dimensional Ungerboeck-type trellis codes based on $2^n$-way two dimensional lattice partitions $Z^2/R^n Z^2$, where $Z^2$ is the lattice of integer pairs and R is the two-dimensional rotation operator defined by the 2×2 matrix {1,1). (1,−1)}. In sequence space, a lattice $\Lambda$ can also be viewed as a trellis code $\underline{C}(\Lambda/\Lambda; C) = (\Lambda)^\infty$, which is based on the trivial lattice partition $\Lambda/\Lambda$ and a trivial rate-1 convolutional code, whose generator matrix G is an identity.

For all known codes $\underline{C}$, given any encoder state $s_k$, the set of all possible next outputs is a coset of some lattice $\Lambda_0$, called the time-zero lattice The fundamental regions $R_0$ of the time zero lattice play a central role in trellis precoding. For a two-dimensional code $\underline{C}(Z^2/R^n Z^2; C)$, the time-zero lattice is $\Lambda_0 = R^{n-k} Z^2$.

If $\underline{C}$ is a linear code, i.e., a group under sequence addition, then it will carry the key properties of lattices. For example, we can define a fundamental region $\underline{R}(C)$ of $\underline{C}$ as a set of sequences that contains one and only one sequence (a coset representative) from each distinct coset $\underline{C}+a(D)$ of $\underline{C}$. Also say any sequence $y(D)$ can be uniquely decomposed as $y(D)=c(D)+e(D)$, where $c(D)\epsilon\underline{C}$ and $e(D)\epsilon\underline{R}(\underline{C})$. Thus, a coset representative sequence $e(D)\epsilon\underline{R}(\overline{C})$ can be recovered from $y(D)=c(D)+e(D)$, without any knowledge about $c(D)$, by first finding the sequence $c(D)$ using the decoder $\underline{D}(\underline{C},\underline{R})$ for the fundamental region $\underline{R}(C)$, and then forming the error sequence $e(D)=y(D)-c(D)$.

A trellis code is linear, if and only if the labeling function $\zeta(b)$ is linear; i.e., $\zeta(b\theta b')=\zeta(b)+\zeta(b)$, where b, b' are two q-tuples. Most known trellis codes, although nonlinear, exhibit sufficient reqularity such that their geometric properties such as distance profile or the shape of their Voronoi regions are independent of the code sequence $c(D)$. All trellis codes with an isometric labeling function exhibit such geometric uniformity. For such codes, the decision regions for some given decoder are not simple translates of each other. But they can be transformed into another by isometric transformations, which consist of translations, rotations or reflections. The following theorems play an important role in trellis precoding.

Theorem 1: Let $\underline{C}_s$ be a trellis code, possibly nonlinear, with a time-zero lattice $\Lambda_{0s}$, then any sequence $y(D)$ can be uniquely decomposed as $y(D)=e(D)+c_s(D)$, where $c_s(D)\epsilon\underline{C}_s$ and $e(D)$ is a coset representative sequence whose elements belong to some fundamental region $\underline{R}_{0s}$ of $\Lambda_{0s}$. An unknown coset representative sequence $e(D)$ can be recovered from $y(D)$ by first finding the code sequence $c_s(D)$ with a hard-decision decoder based on $\underline{R}_{0s}$ and then forming the error sequence $e(D)=y(D)-c_s(D)$ Proof: Suppose at time k we are in state $s_k$ $\underline{C}_s$. Then the next allowable symbols $c_{s,k}$ belong to some coset $\Lambda_{0s}+a(s_k)$ of the time-zero lattice $\Lambda_{0s}$. Hence, we can use a decoder $\underline{D}(\underline{R}_{0s})$ for $\Lambda_{0s}+a(s_k)$ to obtain the decomposition $y_k=e_k+c_{s,k}$, where $c_{s,k}\epsilon\Lambda_{0s}+a(s_k)$ and $e_k\epsilon\underline{R}_{0s}$. Next, we let $c_{s,k}$ determine the next-state $s_{k+1}$ and then repeat the same argument for time $k+1$, and so on. Thus, starting from a kown state $s_0$, the sequences $e(D)$ and $c_s(D)$ in the decomposition $y(D)=e(D)+c_s(D)$ will be uniquely determined. Q.E.D.

Theorem 1 implies that if $e(D)$ is some information-bearing signal whose symbols $e_k$ are constrained to lie in the fundamental region $\underline{R}_{0s}$, then we can add an unknown code sequence $c_s(D)$ from $\underline{C}_s$ to $e(D)$, and we will be able to recover $e(D)$ from the resulting sequence $y(D)=e(D)+c_s(D)$ perfectly without the knowledge of $c_s(D)$. In fact, the above proof shows that the symbols $e_k$ can be recovered with no delay from the symbols $y_k$ up to time k by a simple 'hard decision' decoder for $\underline{C}_s$. Typically, $\underline{R}_{0s}$ is chosen as a simple rectangular region, and then decisions on $c_{c,k}$ may be made coordinate by coordinate.

If $\underline{C}(\Lambda/\Lambda'; C)$ is a trellis code, then its label translate $\underline{C}(\Lambda/\Lambda'; C+a(D))$ is obtained by replacing the convolutional code C by its coset $C\theta_2(D)$. When $\underline{C}(\Lambda/\Lambda'; C)$ is geometrically uniform, then $\underline{C}(\Lambda/\Lambda'; C\theta_2(D))$ has the same geometric properties as $\underline{C}(\Lambda/\Lambda'; C)$ and it is related to $\underline{C}(\Lambda/\Lambda'; C)$ by an isometric transformation (for linear codes that isometric transformation is a simple translation).

Theorem 2: If $c_c(D)$ and $c_s(D)$ are code sequences in N-dimensional codes $\underline{C}_c$ and $\underline{C}_s$, respectively, and $\Lambda_s$ is a sublattice of $\Lambda_c'$, then $y(D)=c_c(D)+c_s(D)$ is a code sequence in $\underline{C}_c$.

Proof: Every sequence $c_s(D)$ is a sequence of elements of $\Lambda_s$ and therefore of $\Lambda_c'$, which means that $y(D)=c_c(D)\pm c_s(D)$ is a sequence with elements in the same sequence of cosets of $\Lambda_c'$ as $c_c(D)$, so it must be in $\underline{C}_c$. Q.E.D.

We claim:

1. A method of mapping a digital data sequence into a signal point sequence $e(D)$ for data transmission over a channel with impulse response $h(D)$ to produce a channel output sequence $y(D)=e(D)h(D)$, comprising the steps of defining a class of possible sequences based on a time-varying trellis code derived from an N-dimensional time-invariant trellis code $\underline{C}$ by using different transformed versions of its underlying lattices for respectively different N-dimensional symbols, and choosing $e(D)$ so that the signal points in the sequence $y(D)$ belong to said class of possible sequences based on said digital data sequence.

2. The method of claim 1 wherein said class comprises a signal space translate of a time-varying trellis code $\underline{C}_s$, where the translation is a code sequence from a translate of a trellis code $\underline{C}_c$ determined based on said digital data sequence, and said time-varying trellis code $\underline{C}_s$ is derived from an N-dimensional time-invariant trellis code $C(\Lambda/\Lambda', \underline{C}_s)$ by using different transformed versions of its underlying lattices $\Lambda$ and $\Lambda$ for respectively different N-dimensional signal points.

3. The method of claim 1 wherein said class comprises a signal space translate of a trellis code $\underline{C}_s$, where the translation is a code sequence from a translate of a time-varying trellis code $\underline{C}_c$ determined based on said digital data sequence and said time varying trellis code $\underline{C}_c$ is derived from an N dimensional time-invariant trellis code $\underline{C}(L/L', C_c)$ by using different transformed versions of its underlying lattices L and L' for respectively different N dimensional signal points.

4. The method of claim 1 wherein said class comprises a signal space translate of a label translate of a time-varying trellis code $\underline{C}_s$, where the label translate is based on a portion of said digital data sequence and the signal space translation is based on another portion of the elements of said digital data sequence, and the time-varying trellis code $\underline{C}_s$ is derived from an N-dimensional time-invariant trellis code $\underline{C}(\Lambda/\Lambda', C_s)$ by using different transformed versions of its underlying lattices $\Lambda$ and $\Lambda'$ for respectively different N-dimensional signal points.

5. The method of claim 1 wherein said class comprises a signal space translate of a label translate of a trellis code $\underline{C}_s$, where the label translate is based on a portion of said digital data sequence, where the signal space translation is based on another portion of the elements of said digital data sequence and is a code sequence from a time-varying trellis code $\underline{C}_c$ which is derived from an N-dimensional-time invariant trellis code $\underline{C}(L/L', C_c)$ by using different transformed versions of its underlying lattices L and L' for respectively different N-dimensional signal points.

6. The method of claim 1 wherein said class of possible sequences is identified by some sequence of subregions into which N-space has been partitioned, said sequence of subregions being specified by a label sequence determined based on a portion of the digital data sequence and said signal points in said subregions belonging to a coset of a time-varying trellis code $\underline{C}_c$, where the sequences from said time-varying trellis code $\underline{C}_c$ are chosen based on another portion of the elements of said digital data sequence, and the time-varying trellis code $\underline{C}_c$ is derived from an N-dimensional time-invariant trellis code $\underline{C}(L/L', C_c)$ by using different transformed versions of its underlying lattices L and L' for respectively different N-dimensional signal points.

7. The method of claim 1 wherein said class of possible sequences is identified by some sequence of subregions into which N-space has been partitioned, said sequence of subregions being specified by a label sequence, which belongs to a coset of a convolutional code $C_s$, based on a portion of the elements of the digital data sequence and using different scaled versions of said subregions for respectively different N-dimensional signal points, said coset being determined based on another portion of the digital data sequence, where the signal points in the sequence y(D) are chosen based on a portion of the elements of said digital data sequence, and wherein said subregions are scaled versions of each other.

8. A method of mapping a digital data sequence into a signal point sequence e(D) for data transmission over a channel h(D) (h(D) not a constant) to produce a channel output sequence $y(D)=e(D)h(D)$, comprising the steps of
  defining a label translate of a trellis code $\underline{C}_s$ based on a portion of said digital data sequence, and
  choosing e(D) so that y(D) belongs to a signal space translate of said label translate, said signal space translation being specified based on another portion of the elements of said digital data sequence and being a code sequence from a trellis code $\underline{C}_c$.

9. A method of mapping a digital data sequence into a signal point sequence e(D) for data transmission over a channel h(D) (h(D) not a constant) to produce a channel output sequence $y(D)=e(D)h(D)$, comprising the steps of
  defining a label sequence based on a portion of the elements of the digital data sequence,
  specifying a sequence of subregions into which N-space has been partitioned based on said label sequence, signal points in said subregions belonging to a coset of a trellis code $C_c$, and
  choosing e(D) so that the signal points in the sequence y(D) belong to said specified sequence of subregions, sequences from said trellis code $\underline{C}_c$ being chosen based on another portion of the elements of said digital data sequence.

10. The method of claim 6, 7 or 9 wherein said label sequence belongs to a coset of a convolutional code $C_s$.

11. The method of claim 1, 2, 3, 4, 5, or 6 wherein said transformed versions are respectively used periodically.

12. The method of claim 11 wherein each period in which said transformed versions are used periodically encompasses multiple N-dimensional symbols.

13. The method of claim 1, 2, 3, 4, 5, or 6 wherein only two said different transformed versions are used alternatingly.

14. The method of claim 1, 2, 3, 4, 5, or 6 wherein said transformed versions comprise rotated or scaled or rotated and scaled versions of said underlying lattices.

15. The method of claim 2, 3, 4, 5, 8, or 9 further comprising the step of filtering said trellis code $\underline{C}_s$ to form a filtered trellis code $\underline{C}_s'$, whose sequences are $c_s'(D)=c_s(D)g(D)$ where g(D) is the formal inverse of a response related to the channel response h(D), and $c_s(D)$ is any code sequence in the trellis code $\underline{C}_s$.

16. The method of claim 15 in which the signal point sequence selection tends to minimize the average power of the signal point sequence $e(D)=y(D)g(D)$.

17. The method of claim 16 wherein said signal point sequence e(D) lies in a fundamental region of said filtered trellis code $\underline{C}_s'$.

18. The method of claim 15 wherein said signal point sequence e(D) lies in a fundamental region of said filtered trellis code $\underline{C}_s'$.

19. The method of claim 18 wherein said fundamental region of said filtered trellis code $\underline{C}_s'$ comprises a Voronoi region of said filtered trellis code $\underline{C}_s'$.

20. The method of claim 15 in which the signal point sequence is selected based on reduced state sequence estimation with respect to said filtered trellis code $\underline{C}_s'$.

21. The method of claim 20 in which the reduced state sequence estimation uses no more states than the number of states of the original filtered trellis code $\underline{C}_s'$.

22. The method of claim 15 wherein said signal point sequence is selected by
  mapping said digital data sequence into an initial sequence belonging to and representing a congruence class of said trellis code $\underline{C}_s$, and
  choosing a signal point sequence belonging to and representing a congruence class of said filtered trellis code $\underline{C}_s'$ and which has no greater average power than said initial sequence, and wherein
  said mapping includes applying a portion of the elements of said digital data sequence to a coset representative generator for forming a larger number of digital elements representing a coset representative sequence.

23. The method of claim 22 wherein said coset representative generator comprises a multiplication of a portion of the elements of said digital data sequence by a coset representative generator matrix $(H^{-1})^T$ which is inverse to a syndrome-former matrix $H^T$ for said trellis code $\underline{C}_s$.

24. The method of claim 23 further comprising the step of recovering the digital data sequence from a possibly filtered and noise-corrupted version of the signal point sequence, including decoding the signal point sequence to a sequence of estimated digital elements and forming a syndrome of fewer digital elements based on a portion of the estimated digital elements using a feedback-free syndrome former $H^T$.

25. The method of claim 1, 2, 3, 4, 5, 6, 7, 8 or 9 further comprising the step of recovering the digital data sequence from a possibly noise-corrupted version of the signal point sequence, including decoding the signal point sequence to a sequence of estimated digital elements and forming a syndrome of fewer digital elements based on a portion of the estimated digital elements using a feedback-free syndrome former $H^T$.

26. The method of claim 2, 3, 4, 5, 8, or 9 wherein said trellis code $\underline{C}_s$ is a linear trellis code.

27. The method of claim 25 wherein said linear trellis code $\underline{C}_s$ is a 4-state Ungerboeck code.

28. The method of claim 2, 3, 4, 5, 8, or 9 wherein said trelis code $\underline{C}_s$ is a non-linear trellis code.

29. The method of claim 2, 3, 4, 5, 8, or 9 wherein said trellis code $\underline{C}_s$ is based on a partition of binary lattices.

30. The method of claim 2, 3, 4, 5, 8, or 9 wherein said trellis code $\underline{C}_s$ is based on a partition of ternary or quaternary lattices.

31. The method of claim 1, 2, 3, 4, 5, 6, 7, 8, or 9 further comprising the step of selecting said signal point sequence in a manner which is constrained so as to reduce the peak power of said signal point sequence where said peak power represents the maximum energy of said signal point sequence in some number of dimensions N.

32. The method of claim 31 wherein N=2.

33. The method of claim 31 wherein N=4.

34. The method of claim 1, 2, 3, 4, 5, 6, 7, 8, or 9 further comprising the step of mapping said digital data sequence into said signal point sequence in a manner arranged to ensure that said digital data sequence can be recovered from a channel-affected version of said signal point sequence which has been subjected to one of a number of particular phase rotations.

* * * * *

UNITED STATES PATENT AND TRADEMARK OFFICE
CERTIFICATE OF CORRECTION

PATENT NO. : 5,214,672

DATED : May 25, 1993

INVENTOR(S) : Vedat Eyuboglu and Michael P. Chen

Page 1 of 2

It is certified that error appears in the above-indentified patent and that said Letters Patent is hereby corrected as shown below:

In column 9, line 58, "q(d)" should be

In column 10, line 28, "$S' = S\pi_1 \leq i \times k^{2j_i - r_s}$." should be -- $S' = S \Pi_{1 \leq i \leq K} 2^{j_i - r} s.$ --

In column 16, line 59, "17(4j+2)]" should be --I7(4j+2)]--.

In column 17, line 4, "$(H^-)^T$" should be --$(H^{-1})^T$--.

In column 17, line 13, "3j+1" should be --4j+1--.

In column 18, line 39, insert - before "$|e_i(4j+1-1)h_i - e_i ....$"

In column 19, line 10, delete "15" after "of".

In column 20, line 5, insert --.-- at the end of the line.

In column 23, line 38, "$|e_j|^2 = |y(z_k = t_k ...$" should be --$|e_j|^2 = |y(z_{k2} = t_k ...$--.

In column 23, line 55 "ad" should be --and-- (our error).

UNITED STATES PATENT AND TRADEMARK OFFICE
CERTIFICATE OF CORRECTION

PATENT NO. : 5,214,672
DATED : May 25, 1993
INVENTOR(S) : Vedat Eyuboglu and Michael P. Chen It is certified that error appears in the above-indentified patent and that said Letters Patent is hereby corrected as shown below:

In column 25, line 65 insert --.-- after "addition".
In column 27, line 39 "$S_k C_s$." should be --$S_k$ of $C_s$.--

In column 27, line 45 "kown" should be --known-- (our error).

In column 28, line 31 "A and A" should be --A and $A^1$--.

In column 30, line 63 "trelis" should be --trellis--.

In column 31, line 2 delete "the step of" after "comprising".

Signed and Sealed this

Sixth Day of December, 1994

BRUCE LEHMAN

Attest:

Attesting Officer

Commissioner of Patents and Trademarks